(12) United States Patent
Chen et al.

(10) Patent No.: US 7,920,407 B2
(45) Date of Patent: Apr. 5, 2011

(54) SET AND RESET DETECTION CIRCUITS FOR REVERSIBLE RESISTANCE SWITCHING MEMORY MATERIAL

(75) Inventors: Yingchang Chen, Cupertino, CA (US); Marco Cazzaniga, Palo Alto, CA (US)

(73) Assignee: SanDisk 3D, LLC, Milpitas, CA (US)

( * ) Notice: Subject to any disclaimer, the term of this patent is extended or adjusted under 35 U.S.C. 154(b) by 158 days.

(21) Appl. No.: 12/395,859

(22) Filed: Mar. 2, 2009

(65) Prior Publication Data
US 2010/0085794 A1  Apr. 8, 2010

Related U.S. Application Data

(60) Provisional application No. 61/103,225, filed on Oct. 6, 2008.

(51) Int. Cl.
*G11C 11/00* (2006.01)
(52) U.S. Cl. ............... 365/148; 365/189.07; 365/189.16
(58) Field of Classification Search .................. 365/148, 365/189.11, 203, 121, 189.16, 189.07
See application file for complete search history.

(56) References Cited

U.S. PATENT DOCUMENTS

| | | | |
|---|---|---|---|
| 3,422,285 A | 1/1969 | Schlichting | |
| 5,915,167 A | 6/1999 | Leedy | |
| 6,034,882 A | 3/2000 | Johnson | |
| 6,097,632 A | 8/2000 | Roohparvar | |
| 6,420,215 B1 | 7/2002 | Knall | |
| 6,525,953 B1 | 2/2003 | Johnson | |
| 6,574,145 B2 | 6/2003 | Kleveland | |
| 6,940,744 B2 | 9/2005 | Rinerson | |
| 6,951,780 B1 | 10/2005 | Herner | |
| 6,952,030 B2 | 10/2005 | Herner | |
| 6,952,043 B2 | 10/2005 | Vyvoda | |

(Continued)

FOREIGN PATENT DOCUMENTS
EP    1308960    5/2003

OTHER PUBLICATIONS

International Search Report & The Written Opinion of the International Searching Authority dated Mar. 11, 2010, International Application No. PCT/US2009/057979 filed Sep. 23, 2009.

*Primary Examiner* — Richard Elms
*Assistant Examiner* — Hien N Nguyen
(74) *Attorney, Agent, or Firm* — Vierra Magen Marcus & DeNiro LLP

(57) ABSTRACT

Circuitry for performing a set or reset process for a reversible resistance-switching memory element in a memory device. A ramped voltage is applied to the memory cell and its state is constantly monitored so that the voltage can be discharged as soon as the set or reset process is completed, avoiding possible disturbs to the memory cell. One set circuit ramps the voltage using a current source, while detecting a current peak using an op-amp loop. One reset circuit ramps the voltage using an op-amp loop, while detecting a current peak by continuing to draw current at the peak current to maintain the output signal stable. Another set circuit ramps the voltage using an op-amp loop and a source-follower configuration. Another reset circuit ramps the voltage using an op-amp loop and a source-follower configuration with level shifting to reduce power consumption. Faster detection and shutoff, and stable operation, are achieved.

20 Claims, 16 Drawing Sheets

U.S. PATENT DOCUMENTS

| | | |
|---|---|---|
| 7,053,674 B1 | 5/2006 | Romero et al. |
| 7,081,377 B2 | 7/2006 | Cleeves |
| 7,176,064 B2 | 2/2007 | Herner |
| 7,345,907 B2 * | 3/2008 | Scheuerlein .................. 365/148 |
| 7,391,638 B2 | 6/2008 | Fasoli |
| 7,589,989 B2 * | 9/2009 | Fasoli et al. ..................... 365/96 |
| 2006/0087005 A1 | 4/2006 | Herner |
| 2006/0233019 A1 | 10/2006 | Kostylev et al. |
| 2006/0245235 A1 | 11/2006 | Krieger |
| 2006/0250836 A1 | 11/2006 | Herner |
| 2007/0190722 A1 | 8/2007 | Herner |
| 2008/0025076 A1 | 1/2008 | Scheuerlein |
| 2008/0062740 A1 | 3/2008 | Baek et al. |
| 2008/0094892 A1 | 4/2008 | Fasoli et al. |
| 2008/0151601 A1 * | 6/2008 | Kang et al. .................... 365/148 |
| 2009/0001343 A1 | 1/2009 | Schricker |
| 2009/0230924 A1 * | 9/2009 | Wright .......................... 320/148 |
| 2009/0323392 A1 * | 12/2009 | Fasoli et al. .................. 365/148 |

* cited by examiner

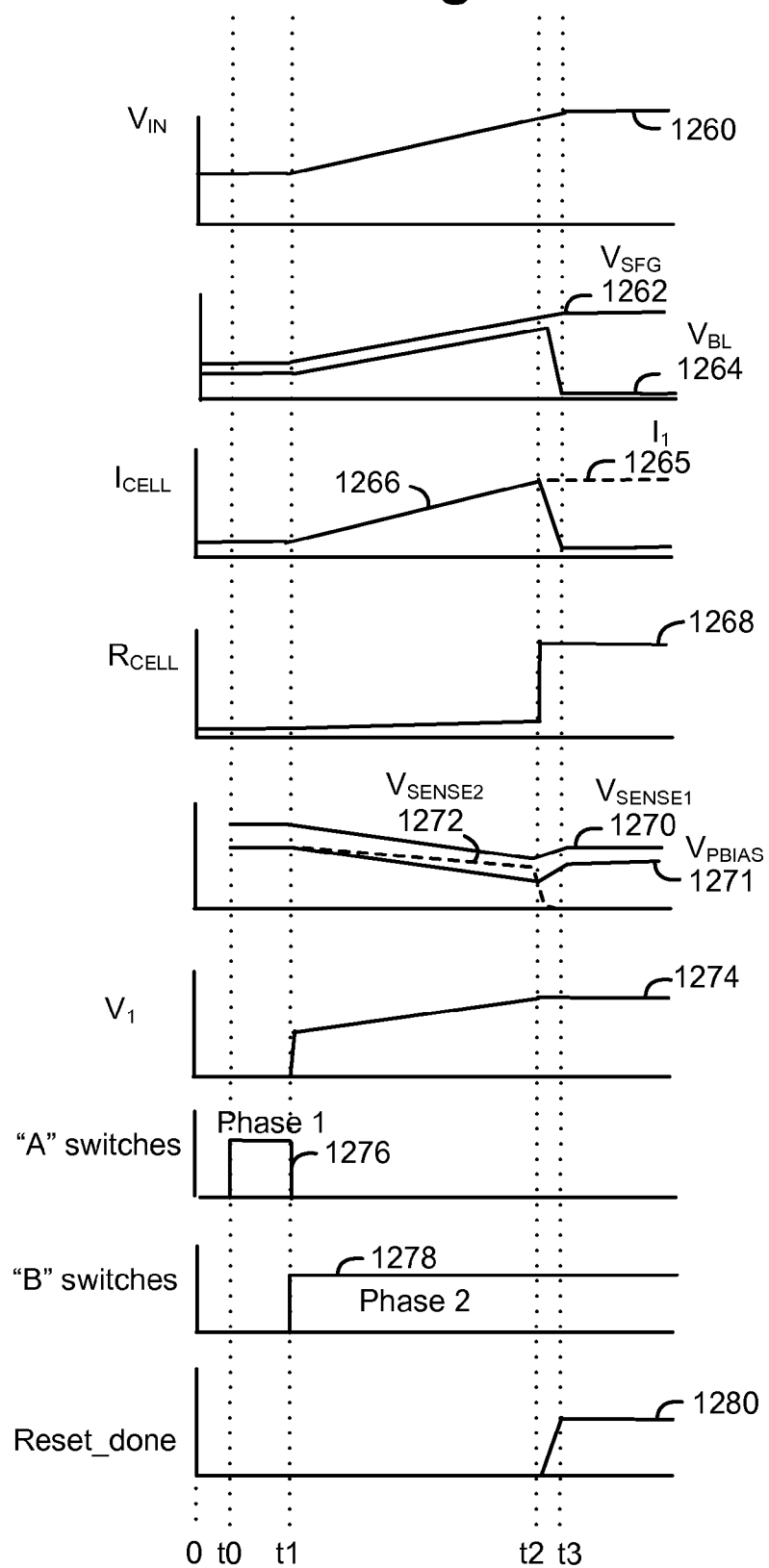

SET AND RESET DETECTION CIRCUITS FOR REVERSIBLE RESISTANCE SWITCHING MEMORY MATERIAL

CROSS REFERENCE TO RELATED APPLICATIONS

This application claims the benefit of U.S. provisional patent application No. 61/103,225, filed Oct. 6, 2008, incorporated herein by reference.

BACKGROUND

The present invention relates to technology for data storage.

A variety of materials show reversible resistance-switching behavior. These materials include chalcogenides, carbon polymers, perovskites, and certain metal oxides and nitrides. Specifically, there are metal oxides and nitrides which include only one metal and exhibit reliable resistance switching behavior. This group includes, for example, NiO, $Nb_2O_5$, $TiO_2$, $HfO_2$, $Al_2O_3$, $MgO_x$, $CrO_2$, VO, BN, and AlN, as described by Pagnia and Sotnick in "Bistable Switching in Electroformed Metal-Insulator-Metal Device," Phys. Stat. Sol. (A) 108, 11-65 (1988). A layer of one of these materials may be formed in an initial state, for example a relatively low-resistance state. Upon application of sufficient voltage, the material switches to a stable high-resistance state. This resistance switching is reversible such that subsequent application of an appropriate current or voltage can serve to return the resistance-switching material to a stable low-resistance state. This conversion can be repeated many times. For some materials, the initial state is high-resistance rather than low-resistance. A set process may refer to switching the material from high to low resistance, while a reset process may refer to switching the material from low to high resistance.

These reversible resistance-switching materials are of interest for use in nonvolatile memory arrays. One resistance state may correspond to a data "0," for example, while the other resistance state corresponds to a data "1." Some of these materials may have more than two stable resistance states.

Non-volatile memories that have storage elements or cells formed from reversible resistance-switching material are known. For example, U.S. Patent Application Publication 2006/0250836, filed May 9, 2005 and titled "Rewriteable Memory Cell Comprising A Diode And A Resistance-Switching Material," which is hereby incorporated by reference herein in its entirety, describes a rewriteable non-volatile memory cell that includes a diode coupled in series with a reversible resistance-switching material such as a metal oxide or metal nitride.

However, controlling the switching process can be problematic. For example, if an insufficient voltage is applied, the cell may not change state. On the other hand, if an unnecessarily high voltage is applied to one cell, other cells may be disturbed and change states unexpectedly. Moreover, due to manufacturing variations, different memory cells may switch at different applied voltages.

SUMMARY

Apparatuses are presented for detecting set and reset processes for a reversible resistance-switching element in a memory device.

In one embodiment, an apparatus for detecting a set process for a reversible resistance-switching element in a memory device includes a bit line which is coupled to the reversible resistance-switching element. A current supply is also provided. The bit line is connected as a current mirror of the current supply, and the current supply causes a voltage of the bit line to ramp up until the voltage of the bit line is sufficient to switch a resistance of the reversible resistance-switching element to a lower level. A peak detector is coupled to the bit line. The peak detector detects when the resistance of the resistance-switching element switches.

In another embodiment, an apparatus for detecting a reset process for a reversible resistance-switching element in a memory device includes an operational amplifier, where a ramped up voltage is input to a first input terminal of the operational amplifier. A bit line is coupled to the reversible resistance-switching element. The operational amplifier generates a voltage in the bit line which increases in correspondence with the ramped up voltage until the voltage in the bit line reaches a level which is sufficient to switch a resistance of the resistance-switching element to a higher level. A sense line is also provided, where the operational amplifier generates a current in the sense line which increases in correspondence with the ramped up voltage until the resistance of the resistance-switching element switches to a higher level. A peak detector is coupled to the sense line. The peak detector detects when the resistance of the resistance-switching element switches, and includes circuitry which draws current from the sense line before and after the resistance-switching element switches.

In another embodiment, an apparatus for detecting a set process includes an operational amplifier, where a ramped up voltage is input to a first input terminal of the operational amplifier. A first transistor has a gate which is coupled to the operational amplifier. The operational amplifier provides a voltage at the gate, and a voltage at a source of the first transistor follows the voltage at the gate. A bit line is coupled to the reversible resistance-switching element and to the source of the first transistor. A comparator has a first input terminal coupled to a drain of the first transistor and a second input terminal which receives a fixed reference voltage.

In another embodiment, an apparatus for detecting a reset process includes an operational amplifier, where a ramped up voltage is input to a first input terminal of the operational amplifier. A first transistor has a gate which is coupled to the operational amplifier. The operational amplifier provides a voltage at the gate, and a voltage at a source of the first transistor follows the voltage at the gate. A bit line is coupled to the reversible resistance-switching element and to the source of the first transistor. A sense line is connected as a mirror of the bit line. A peak detector is coupled to the sense line to detect when a resistance of the reversible resistance-switching element switches to a higher level.

Corresponding methods, systems and computer- or processor-readable storage devices which have executable code for performing the methods provided herein may also be provided.

DETAILED DESCRIPTION

A memory system is provided that includes memory cells with a reversible resistivity-switching element. Various circuits and methods are disclosed for controlling the setting of the resistance for the reversible resistance-switching elements.

Figure 1:
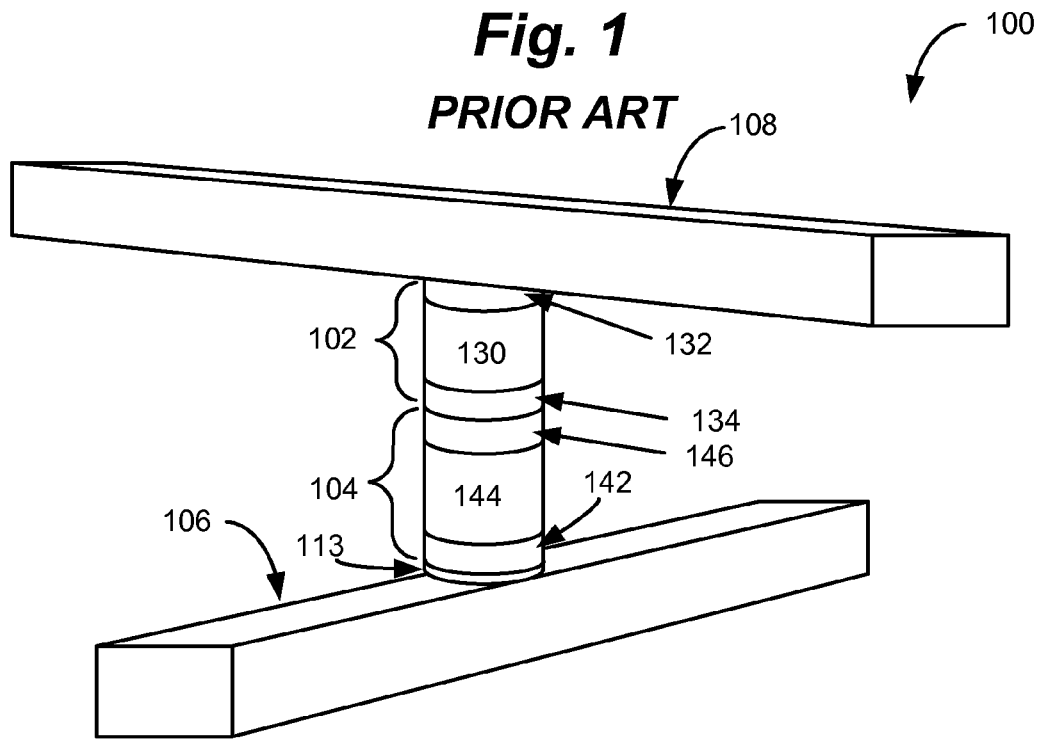
FIG. 1 is a simplified perspective view of one embodiment of a memory cell with a reversible resistance-switching element.

FIG. 1 is a simplified perspective view of one embodiment of a memory cell 100 which includes a reversible resistance-switching element 102 coupled in series with a steering element 104 between a first conductor 106 and a second conductor 108.

Reversible resistance-switching element 102 includes reversible resistivity-switching material 130 having a resistivity that may be reversibly switched between two or more states. For example, the reversible resistivity-switching material may be in an initial high-resistivity state upon fabrication that is switchable to a low-resistivity state upon application of a first voltage and/or current. Application of a second voltage and/or current may return the reversible resistivity-switching material to the high-resistivity state. Alternatively, the reversible resistance-switching element may be in an initial low-resistance state upon fabrication that is reversibly switchable to a high-resistance state upon application of the appropriate voltage(s) and/or current(s). When used in a memory cell, one resistance state may represent a binary "0" while another resistance state may represent a binary "1." However, more than two data/resistance states may be used. Numerous reversible resistivity-switching materials and operation of memory cells employing reversible resistance-switching materials are described, for example, in U.S. Patent Application Publication 2006/0250836, previously incorporated.

In one embodiment, the process of switching the resistance from the high-resistivity state to the low-resistivity state is referred to as setting the reversible resistance-switching element 102. The process of switching the resistance from the low-resistivity state to the high-resistivity state is referred to as resetting the reversible resistance-switching element 102. The high-resistivity state is associated with binary data "0" and the low-resistivity state is associated with binary data "1." In other embodiments, setting and resetting and/or the data encoding can be reversed. The set or reset process can be performed for a memory cell to program it to a desired state to represent binary data.

In some embodiments, reversible resistance-switching material 130 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 130 includes at least a portion of a nickel oxide layer formed by selectively depositing nickel and then oxidizing the nickel layer. For example, Ni, NixPy or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO-, NiOx- or NiOxPy-containing layer may be selectively deposited above the steering element 104 using a selective deposition process and then annealed and/or oxidized (if necessary).

Other materials may be selectively deposited, and then annealed and/or oxidized if necessary, in accordance with the present invention to form reversible resistivity-switching materials for use in memory cells. For example, a layer of Nb, Ta, V, Al, Ti, Co, cobalt-nickel alloy, etc., may be selectively deposited, such as by electroplating, and oxidized to form a reversible resistivity-switching material.

More information about fabricating a memory cell using reversible resistance-switching material can be found in US 2009/0001343, published Jan. 1, 2009, titled "Memory Cell That Employs a Selectively Deposited Reversible Resistance Switching Element and Methods of Forming The Same," and incorporated herein by reference in its entirety.

Reversible resistance-switching element 102 includes electrodes 132 and 134. Electrode 132 is positioned between metal oxide reversible resistivity-switching material 130 and conductor 108. In one embodiment, electrode 132 is made of platinum. Electrode 134 is positioned between metal oxide reversible resistivity-switching material 130 and diode 104. In one embodiment, electrode 134 is made of Titanium Nitride, and serves as a barrier layer.

Steering element 104 can be a diode, or other suitable steering element that exhibits non-ohmic conduction by selectively limiting the voltage across and/or the current flow through the reversible resistance-switching element 102. In this manner, the memory cell 100 may be used as part of a two or three dimensional memory array and data may be written to and/or read from the memory cell 100 without affecting the state of other memory cells in the array. Diode 104 may include any suitable diode such as a vertical polycrystalline p-n or p-i-n diode, whether upward pointing with an n-region above a p-region of the diode or downward pointing with a p-region above an n-region of the diode.

In some embodiments, diode 104 may be formed from a polycrystalline semiconductor material such as polysilicon, a polycrystalline silicon-germanium alloy, polygermanium or any other suitable material. For example, the diode 104 may include a heavily doped n+ polysilicon region 142, a lightly doped or an intrinsic (unintentionally doped) polysilicon region 144 above the n+ polysilicon region 142, and a heavily doped p+ polysilicon region 146 above the intrinsic region 144. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 142 to prevent and/or reduce dopant migration from the n+ polysilicon region 142 into the intrinsic region 144, as described, for example, in U.S. Patent Application Publication No. 2006/0087005, filed Dec. 9, 2005 and titled "Deposited Semiconductor Structure To Minimize N-Type Dopant Diffusion And Method Of Making," incorporated herein by reference in its entirety. It will be understood that the locations of the n+ and p+ regions may be reversed.

When diode 104 is fabricated from deposited silicon (e.g., amorphous or polycrystalline), a silicide layer may be formed on the diode to place the deposited silicon in a low resistivity state, as fabricated. Such a low resistivity state allows for easier programming of the memory cell as a large voltage is not required to switch the deposited silicon to a low resistivity state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistivity silicon thereby is provided. Similar results may be achieved for silicon-germanium alloy and/or germanium diodes.

Conductors 106 and 108 include any suitable conductive material such as tungsten, any appropriate metal, heavily doped semiconductor material, a conductive silicide, a conductive silicide-germanide, a conductive germanide, or the like. In the embodiment of FIG. 1, conductors 106 and 108 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 106 and 108 to improve device performance and/or aid in device fabrication.

While the reversible resistance-switching element 102 is shown as being positioned above the steering element 104 in FIG. 1, it will be understood that in alternative embodiments, the reversible resistance-switching element 102 may be positioned below the steering element 104.

Figure 2:
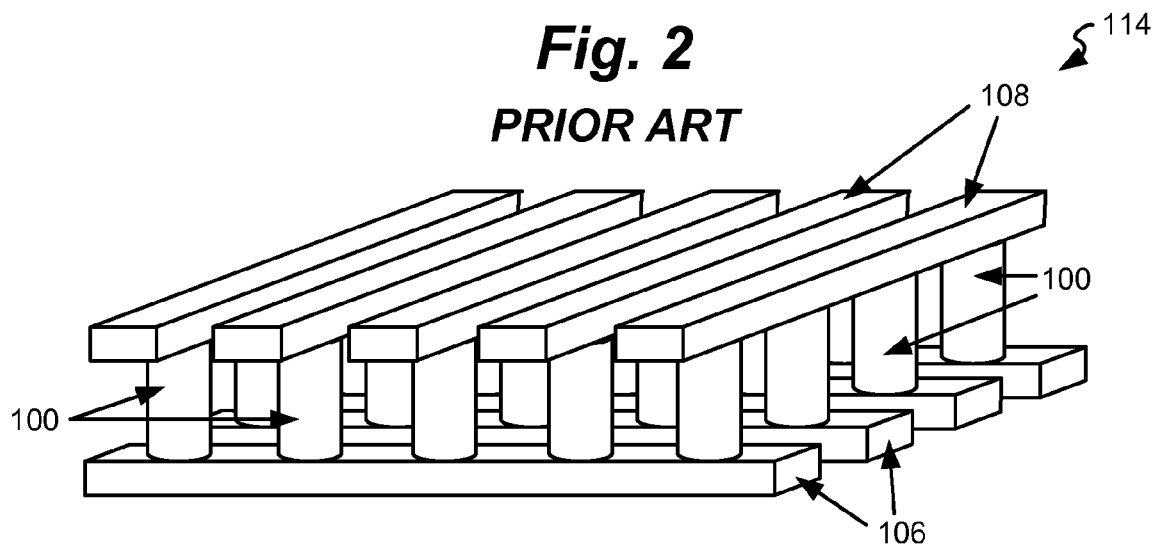
FIG. 2 is a simplified perspective view of a portion of a first memory level formed from a plurality of the memory cells of FIG. 1.

FIG. 2 is a simplified perspective view of a portion of a first memory level 114 formed from a plurality of the memory cells 100 of FIG. 1. For simplicity, the reversible resistance-switching element 102, the diode 104, and barrier layer 113 are not separately shown. The memory array 114 is a "cross-point" array including a plurality of bit lines (second conductors 108) and word lines (first conductors 106) to which multiple memory cells are coupled (as shown). Other memory array configurations may be used, as may multiple levels of memory.

Figure 3:
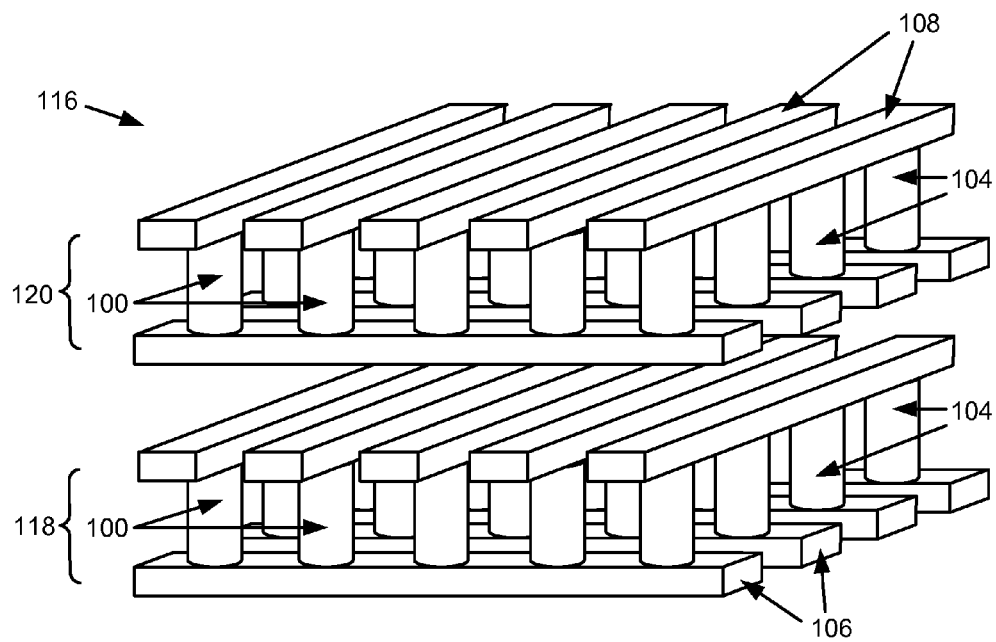
FIG. 3 is a simplified perspective view of a portion of a three dimensional memory array.

FIG. 3 is a simplified perspective view of a portion of a monolithic three dimensional array 116 that includes a first memory level 118 positioned below a second memory level 120. In the embodiment of FIG. 3, each memory level 118 and 120 includes a plurality of memory cells 100 in a cross-point array. It will be understood that additional layers (e.g., an inter-level dielectric) may be present between the first and second memory levels 118 and 120, but are not shown in FIG. 3 for simplicity. Other memory array configurations may be used, as may additional levels of memory. In the embodiment of FIG. 3, all diodes may "point" in the same direction, such as upward or downward depending on whether p-i-n diodes having a p-doped region on the bottom or top of the diode are employed, simplifying diode fabrication.

Figure 4:
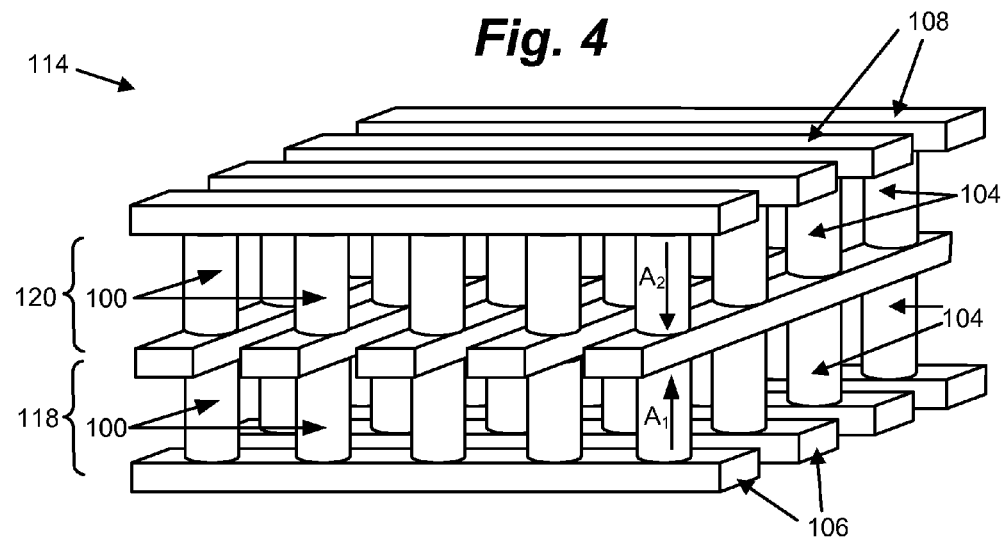
FIG. 4 is a simplified perspective view of a portion of a three dimensional memory array.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 4. In such embodiments, the diodes on adjacent memory levels preferably point in opposite directions, as described in US 2007/0190722, published Aug. 16, 2007, and titled "Large Array Of Upward Pointing P-I-N Diodes Having Large And Uniform Current," which is hereby incorporated by reference herein in its entirety. For example, the diodes of the first memory level 118 may be upward pointing diodes as indicated by arrow A1 (e.g., with p regions at the bottom of the diodes), while the diodes of the second memory level 120 may be downward pointing diodes as indicated by arrow A2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 5:
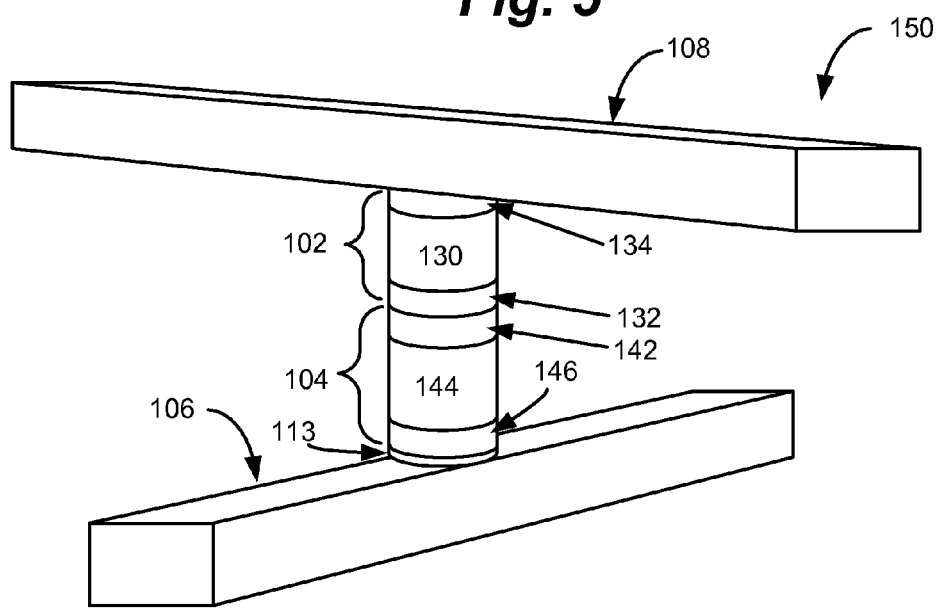
FIG. 5 is a simplified perspective view of another embodiment of a memory cell with a reversible resistance-switching element.

FIG. 5 shows a memory cell 150, which is a variation of memory cell 100 of FIG. 1. Memory cell 150 differs from memory cell 100 of FIG. 1 because the positions of electrodes 132 and 134 are swapped. That is, platinum electrode 132 is positioned between metal oxide reversible resistivity-switching material 130 and diode 104, while Titanium Nitride electrode 134 is positioned between metal oxide reversible resistivity-switching material 130 and conductor 108. It also differs from memory cell 100 of FIG. 1 because the location of n+ region 142 and p+ region 146 are reversed. A heavily doped n+ polysilicon region 142 is above the intrinsic region 144 and a heavily doped p+ polysilicon region 146 is below. This arrangement is useful to set the reversible resistance-switching element when the diode 104 is reverse biased as explained in more detail below.

FIGS. 1-5 show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377. Additionally, other types of memory cells can also be used with the inventions described herein.

Figure 6:
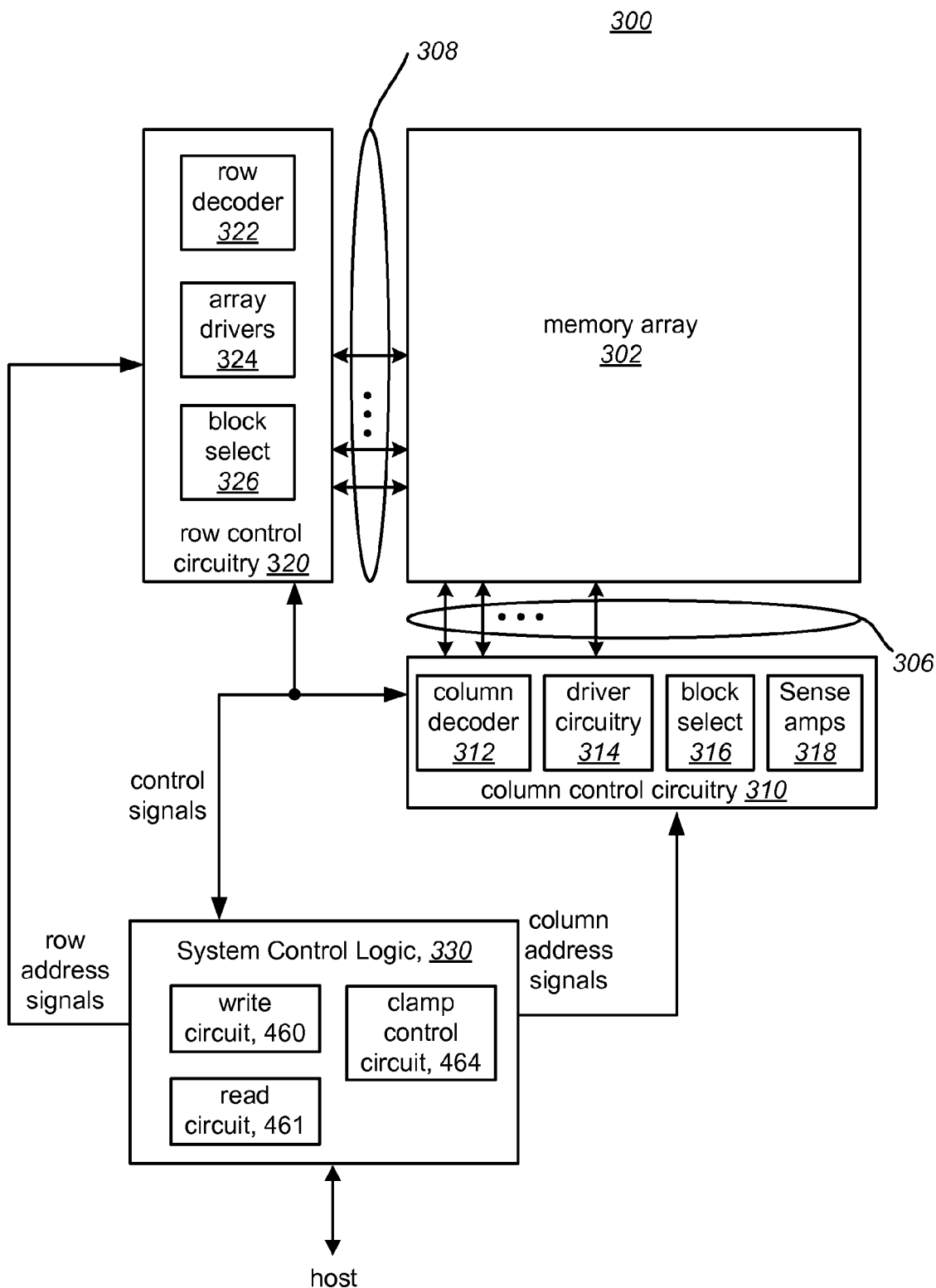
FIG. 6 is a block diagram of one embodiment of a memory system.

FIG. 6 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from system control logic circuit 330, and typically may include such circuits as row decoders 322, array terminal drivers 324, and block select circuitry 326 for both read and programming (e.g., set and reset) operations. Memory system 300 also includes column control circuitry 310 whose input/outputs 306 are connected to respective bit lines of the memory array 302. Column control circuitry 306 receives a group of N column address signals and one or more various control signals from system control logic 330, and typically may include such circuits as column decoders 312, array terminal receivers or drivers 314, block select circuitry 316, as well as read/write circuitry, including sense amps 318, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300. For example, write circuitry 460, read circuitry 461 and clamp control circuitry 464, discussed further below, may be provided.

In one embodiment, all of the components depicted in FIG. 6 are arranged on a single integrated circuit. For example, system control logic 330, column control circuitry 310 and row control circuitry 320 can be formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

Figure 7:
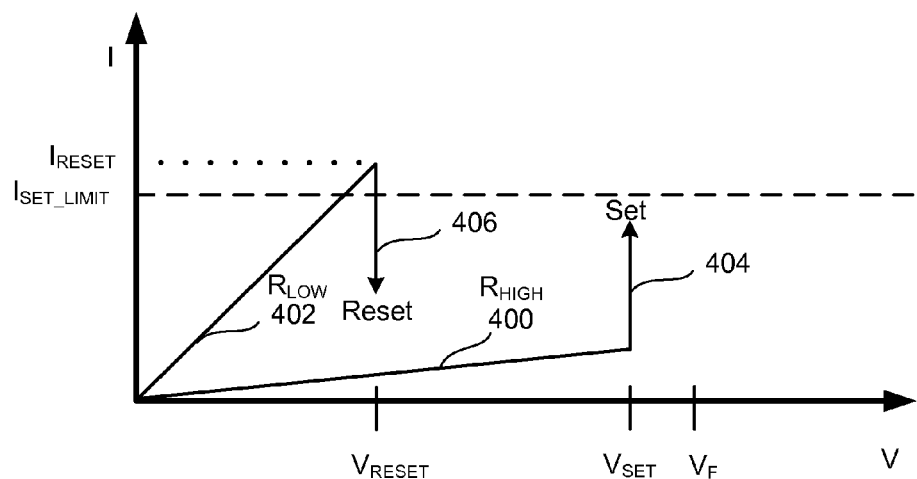
FIG. 7 is a graph depicting I-V characteristics of a reversible resistance-switching element.

As described above, reversible resistance-switching element 102 may be reversibly switched between two or more states. For example, the reversible resistivity-switching material may be in an initial, high-resistivity state upon fabrication that is switchable to a low-resistivity state upon application of a first voltage and/or current. Application of a second voltage and/or current may return the reversible resistivity-switching material to a high-resistivity state. FIG. 7 is a graph of voltage versus current for one example embodiment of a metal oxide reversible resistance-switching element. Line 400 represents the I-V characteristics of the reversible resistance-switching element when in the high-resistivity state ($R_{HIGH}$). Line 402 represents the I-V characteristics of the reversible resistance-switching element when in the low-resistivity state ($R_{LOW}$).

To determine which state the reversible resistance-switching element is in, a voltage is applied and the resulting current is measured. A higher measured current (see line 402) indicates that the reversible resistance-switching element is in the low-resistivity state. A lower measured current (see line 400) indicates that the reversible resistance-switching element is in the high-resistivity state ($R_{HIGH}$). Note that other variations of a reversible resistance-switching element having different I-V characteristics can also be used with the technology herein.

Figure 8:
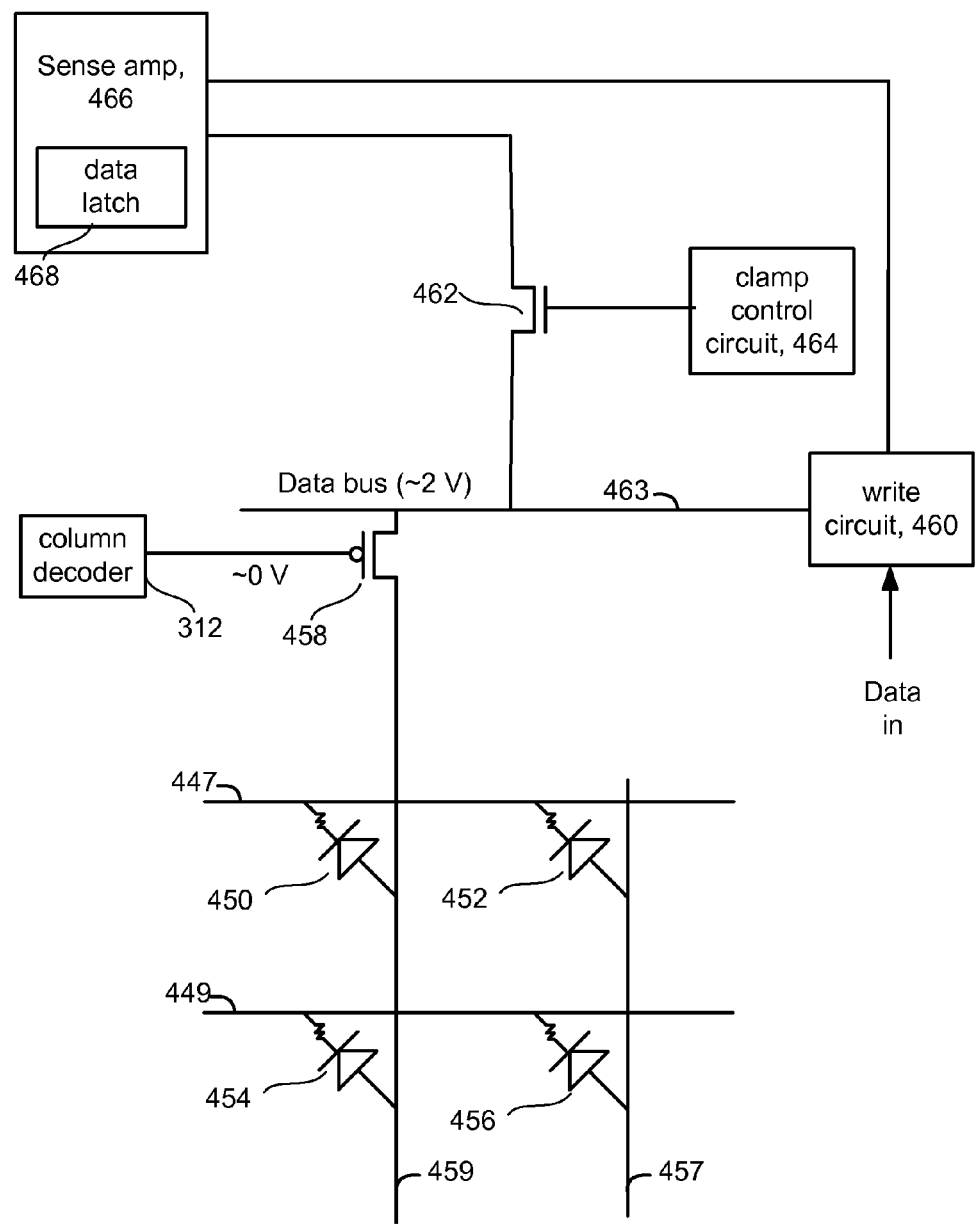
FIG. 8 depicts a circuit for reading the state of a memory cell.

FIG. 8 depicts a circuit that illustrates one embodiment for reading the state of a memory cell. A portion of a memory array includes memory cells 450, 452, 454 and 456, all of which are based on the embodiments of FIGS. 1-5. Two of the many bit lines and two of the many word lines are depicted. Bit line 459 is coupled to cells 450 and 454, and bit line 457 is coupled to cells 452 and 456. Bit line 459 is the selected bit line and may be at 2 V, for instance. Bit line 457 is an unselected bit line and may be at ground, for instance. Word line 447 is the selected word line and may be at 0 V, for instance. Word line 449 is an unselected word line and may be at 2 V, for instance.

A read circuit for one of the bit lines 459 is depicted to be connected to the bit line via transistor 458, which is controlled by a gate voltage supplied by column decoder 312 in order to select or unselect the corresponding bit line. Transistor 458 connects the bit line to a Data bus 463. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to a sense amp 466, which includes a data latch 468. The output of sense amp 466 is connected to a data out terminal (to system control logic 330, a controller and/or a host). Write circuit 460 is also connected to the sense amp 466 and the data latch 468.

When attempting to read the state of the reversible resistance-switching element, all word lines are first biased at $V_{READ}$ (e.g., approximately 2 V) and all bit lines are at ground. The selected word line is then pulled to ground. For example, this discussion will assume that memory cell 450 is selected for reading. One or more selected bit lines 459 are pulled to $V_{READ}$ through the data bus (by turning on transistor 458) and the clamp device (transistor 462, which receives ~2 V+$V_{TH}$, the threshold voltage of the transistor 462). The clamp device's gate is above $V_{READ}$ but controlled to keep the bit line near $V_{READ}$. In one approach, current is pulled by the selected memory cell 450 through transistor 462 from a sense node in the sense amp. The sense node can receive a reference current that is between a high-resistivity state current and a low-resistivity state current. The sense node moves correspondingly to the current difference between the cell current and the reference current. Sense amp 466 generates a data out signal by comparing the sensed voltage to a reference read voltage. If the memory cell current is larger than the reference current, the memory cell is in the low-resistivity state and the voltage at the sense node will be lower than the reference voltage. If the memory cell current is smaller than the reference current, the memory cell is in the high-resistivity state and the voltage at the sense node will be higher than the reference voltage. The output data signal from the sense amp 466 is latched in data latch 468.

Looking back at FIG. 7, while in the high-resistivity state (see line 400), if the voltage $V_{SET}$ and sufficient current is applied, the reversible resistance-switching element will be set to the low-resistivity state. Line 404 shows the behavior when $V_{SET}$ is applied. The voltage will remain somewhat constant and the current will increase toward $I_{SET\_LIMIT}$. At some point, the reversible resistance-switching element will be set and the device behavior will be based on line 402. Note that the first time the reversible resistance-switching element is set, VF (the forming voltage) is needed to set the device. After that, $V_{SET}$ can be used. The forming voltage VF may be greater than $V_{SET}$.

While in the low-resistivity state (see line 402), if the voltage $V_{RESET}$ and sufficient current ($I_{RESET}$) are applied, the reversible resistance-switching element will be reset to the high-resistivity state. Line 406 shows the behavior when $V_{RESET}$ is applied. At some point, the reversible resistance-switching element will be reset and the device behavior will be based on line 400.

In one embodiment, $V_{SET}$ is approximately 5 V, $V_{RESET}$ is approximately 3 V, $I_{SET\_LIMIT}$ is approximately 5 μA and $I_{RESET}$ could be as high as 30 μA.

If the current gets too high during a set operation, it is possible for the reversible resistance-switching element to set and then immediately reset due to the high current. In some cases, the reversible resistance-switching element will oscillate between set and reset. Other unpredictable behavior may also occur.

For some re-writable material used with a diode, if a fixed voltage is applied to let the resistance switch from high to low (the set process), there may be some temporary peak current flowing through the material while switching, which may provide the material enough power to change to some unknown state and create some disturbance.

Also, if we just apply a fixed voltage to cause the memory cell to switch from low to high (in the reset process), the voltage over the memory cell may jump when switching due to the higher resistance, and the higher fixed voltage will provide higher energy to cause the material to jump to some undesired state and create a disturbance as well.

One approach is to apply a fixed voltage for the set process for all memory cells. However, the voltage which is needed to perform the set process can vary among memory cells, and among memory devices, due to manufacturing variations, operating conditions and the like. For example, process/power-supply/temperature (PVT) variations and different locations of the memory cells can be factors. Although a sufficiently high voltage can be applied which cover all the variations and corner cases, this is not optimal since the peak current flowing through the material when switching will go higher accordingly also, which will make the material more vulnerable to unwanted disturbances.

It is proposed, therefore, to apply the lowest possible voltage to the memory cell and detect the material resistance switching at the same time. If the resistance switching is detected, the memory cell will be discharged right away. Such a strategy can minimize the peak current flowing through the material when switching, and avoid any further unwanted material properties change.

Further, by utilizing a ramping pulse, as described below, just enough voltage can be provided to the memory cell, adaptive to PVT and cell location variations, to reduce the chance of unwanted changes for the memory cell.

Figure 9A:
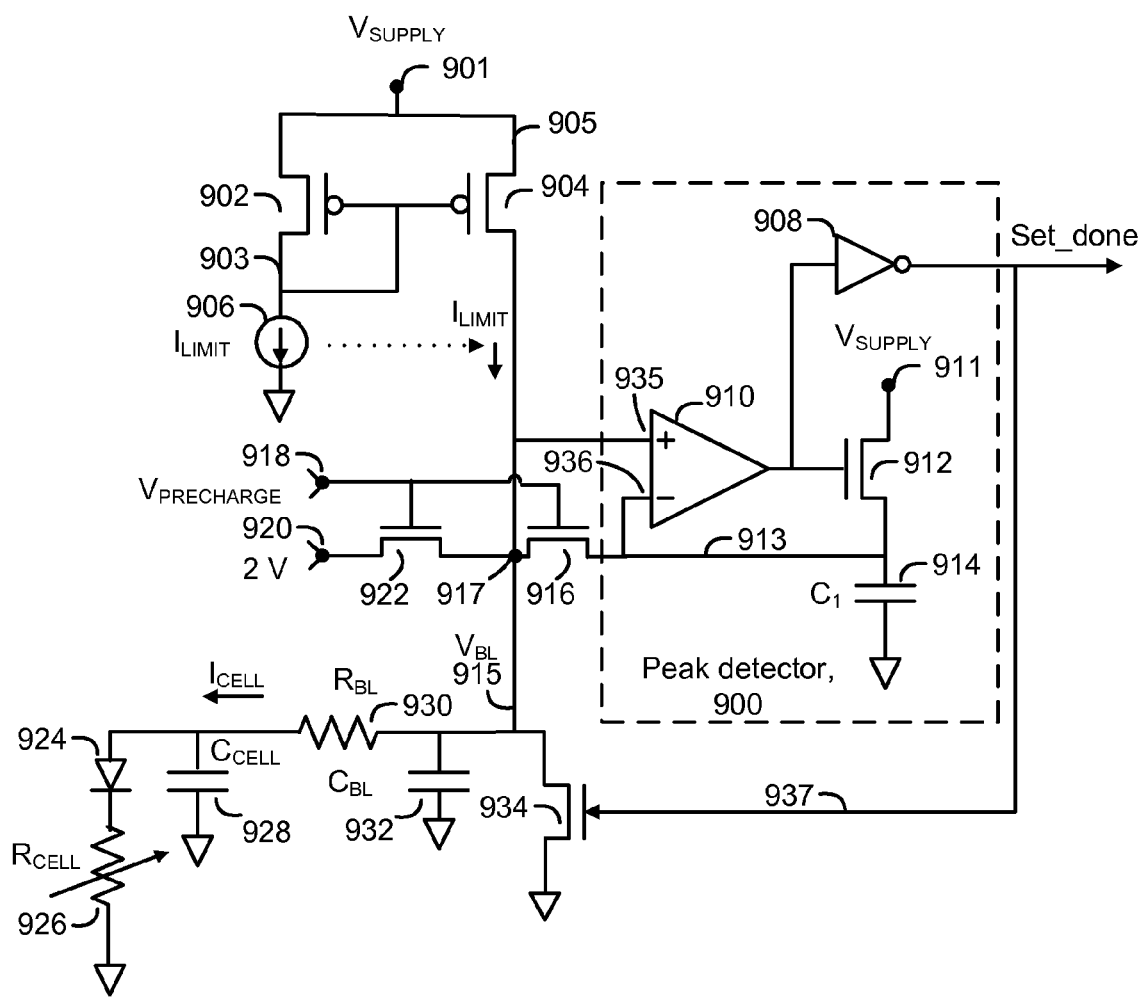
FIG. 9a is a schematic diagram of one embodiment of a circuit used to control a set process of a memory cell, and FIG. 9b provides associated signal levels vs. time.
Figure 9B:
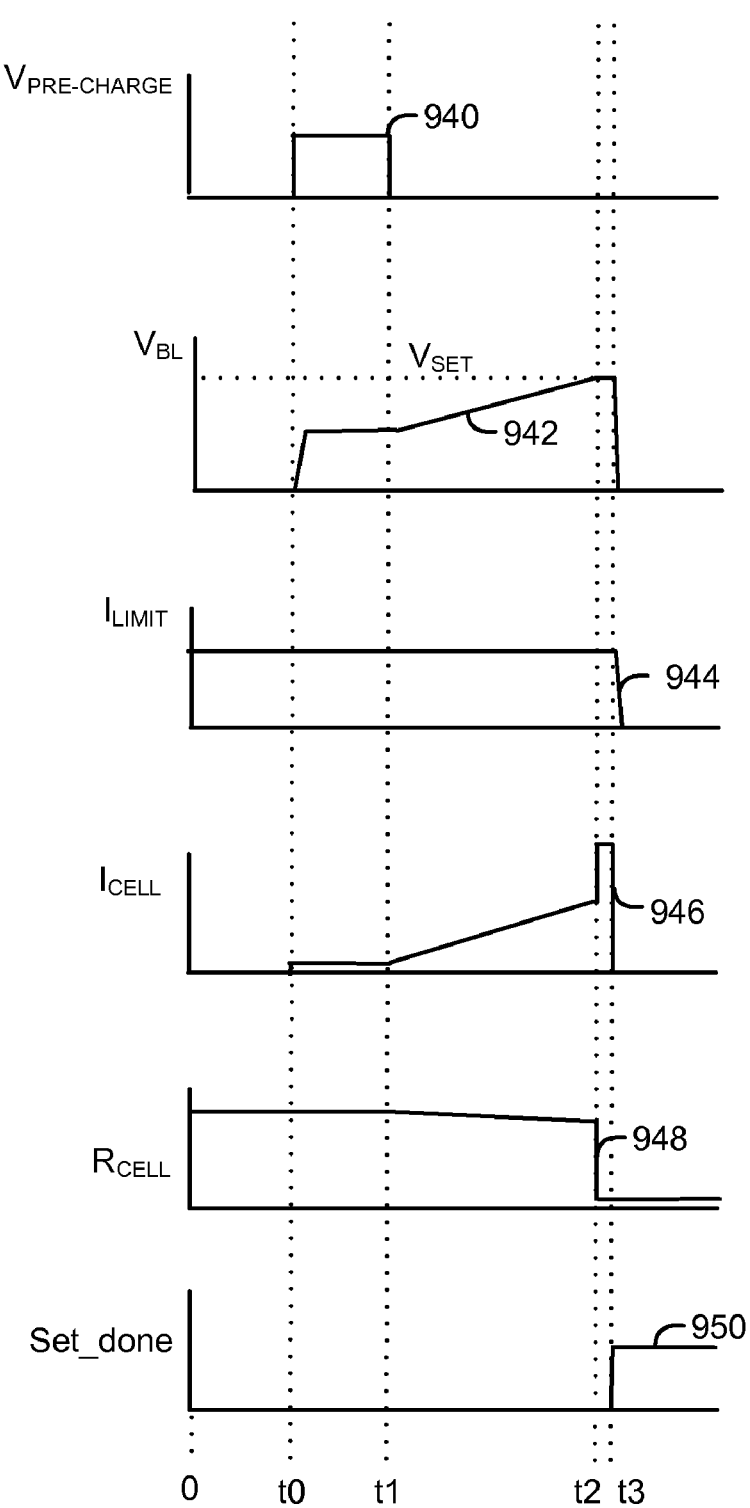
FIG. 9c depicts a drain current vs. gate-to-source voltage characteristic for an n-type MOSFET.
FIG. 9d depicts a drain current vs. gate-to-source voltage characteristic for a p-type MOSFET.
FIG. 9e depicts a drain current vs. drain-to-source voltage characteristic for a MOSFET.

FIG. 9a is a schematic diagram of one embodiment of a circuit used to control a set process of a memory cell, and FIG. 9b provides associated signal levels vs. time. The set and reset circuits provided herein can be selectively coupled to memory cells in a memory device.

The circuit receives a power supply at a potential of $V_{SUPPLY}$ at a node 901. A current 906 supply provides a fixed current $I_{LIMIT}$ in a path 903 which is mirrored to a path 905 via pMOS (p-channel MOSFET) transistors 902 and 904. A pMOS is depicted by a transistor symbol with a small circle at the gate node. An nMOS is depicted by a transistor symbol without a small circle at the gate node. The drain nodes of the pMOS transistors 902 and 904 are coupled to the power supply node 901, and their gate nodes are coupled to one another. The drain and source nodes can be distinguished by the direction of current flow, from source to drain for a pMOS transistor and from drain to source for an nMOS transistor. In the figures, generally, for a pMOS, the source is on the top and the drain is on the bottom. For an nMOS, the source is on the bottom and the drain is on the top. The drain node of the pMOS transistor 902 is coupled to the current source 906, and the drain node of the pMOS transistor 904 is coupled to the bit line 915. The source nodes are coupled to the node 901.

Figure 9C:
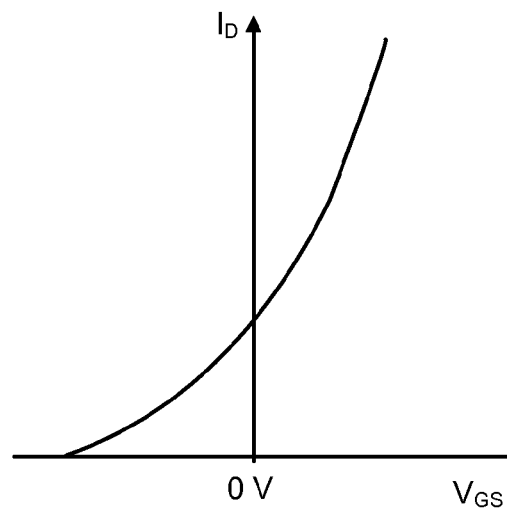
Figure 9D:
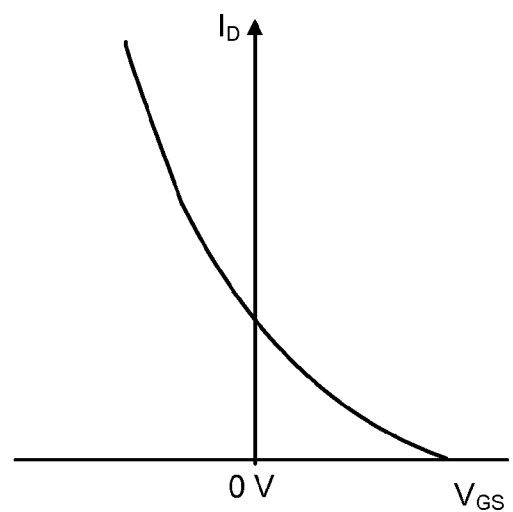
Figure 9E:
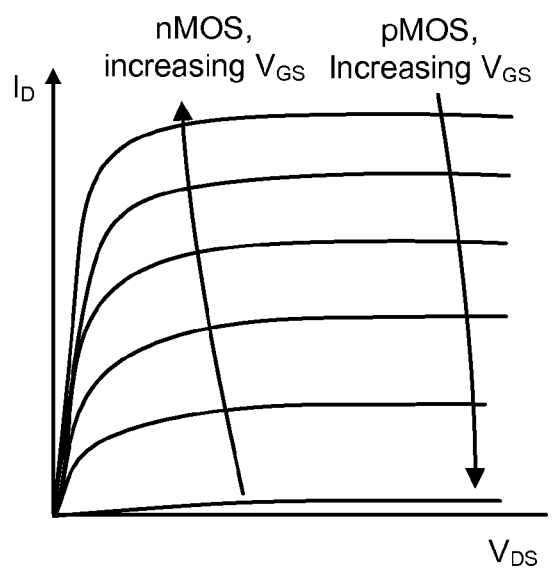

As a review of the operation of a MOSFET, FIG. 9c depicts a drain current ($I_D$) vs. gate-to-source voltage ($V_{GS}$) characteristic for an n-type MOSFET (nMOS). A gate controls the amount of current. In a depletion mode of operation, $V_{GS}<0$, and in an enhancement mode, $V_{GS}>0$ V. FIG. 9d depicts a drain current vs. gate-to-source voltage characteristic for a p-type MOSFET (pMOS). The characteristic is essentially opposite to that of the nMOS. In a depletion mode of operation, $V_{GS}>0$, and in an enhancement mode, $V_{GS}<0$ V. FIG. 9e depicts a drain current vs. drain-to-source voltage characteristic for a MOSFET, either a pMOS or nMOS. Each line is for a constant value of $V_{GS}$, with $V_{GS}$ increasing from negative values at the lower lines to positive values at the higher lines in the case of a nMOS. $V_{GS}$ increases from negative values at the higher lines to positive values at the lower lines in the case of a pMOS. The voltages of the source, drain and gate, and the current from the source to the drain and therefore related, and define a given operating point of a transistor.

The bit line 915 is coupled to a selected memory cell, which is represented by a variable resistance 926 ($R_{CELL}$), a diode 924, and a capacitance 928 ($C_{CELL}$). A resistance and capacitance of the bit line are represented by $R_{BL}$ 930 and $C_{BL}$ 932, respectively. A pre-charge node 918 receives a voltage, $V_{PRECHARGE}$, during a pre-charge phase of a set operation, while a node 920 receives a constant voltage such as 2 V, throughout the set operation. The node 918 is coupled to the gates of nMOS transistors 922 and 916 to pre-charge the bit line at node 917, and to pre-charge a line 913 in a current peak detector 900. An operational amplifier (op-amp) 910, such as an operational transimpedance amplifier, includes a positive (non-inverting) terminal 935 which is coupled to the bit line 915 and a negative (inverting) terminal 936 which is coupled to the line 913.

An output of the op-amp 910 is fed back to the input 936 via a transistor 912, which is coupled at one side to $V_{SUPPLY}$ at a terminal 911 and to a capacitor $C_1$ (914) at the other side. The output of the op-amp is also coupled to an inverter 908, which outputs a control signal "Set_done" to appropriate control circuitry, such as system control logic 330 in FIG. 6, to indicate that the set process is completed. "Set_done" is set when the output of the op-amp transitions from high to low, that is, when the input to the negative terminal 936 transitions to a level which exceeds the input to the positive terminal 935. While MOSFETs are depicted in the example implementation, other FET transistors or other transistors or other switching components could also be used.

During the set procedure, the current source 906 is used to limit the current flowing through the memory cell when charging up the memory cell voltage, and, at the same time, the peak detector 900 keeps the highest voltage of $V_{BL}$, the selected bit line, or selection line, voltage. Once $R_{CELL}$ switches from high to low, which means the set process has occurred, $V_{BL}$ will start to drop. The op-amp 910 will sense the drop, and Set_done will go from low to high. Set_done is coupled to a discharge transistor 934 via a path 937 to immediately discharge the bit line 915 to avoid any disturbance of the memory cell being programmed or other memory cells.

Referring also to FIG. 9b, the set process can proceed as follow in one example implementation. In a pre-charge period between t0 and t1, we pre-charge $V_{BL}$ 942 to $V_{PRECHARGE}$ 940 by applying $V_{PRECHARGE}$ to node 918 and 2 V, for instance, to node 920. $V_{PRECHARGE}$ can be slightly higher than 2 V to account for the threshold voltage of the transistors 922 and 916, e.g., $V_{PRECHARGE}=2V+V_{TH}+\Delta$, where $\Delta$ is an additional increment to ensure that the transistors 922 and 916 remain in the conductive state during the pre-charge.

Between t1 and t2, we ramp $V_{BL}$ from the pre-charged level using the current limiter ($I_{LIMIT}$). $I_{LIMIT}$ 944 provides a fixed current, but the current provided by the pMOS 904 will cause $V_{BL}$ 942 to gradually increase in a ramp-like manner between t1 and t2, since $I_{LIMIT}>I_{CELL}$. The ramp can be a constantly increasing, continuous ramp or an incrementally increasing staircase ramp. $V_{SUPPLY}$ is fixed at, e.g., 3 V. $I_{CELL}$ 946 will also ramp up between t1 and t2 since $I_{CELL}=V_{BL}/R_{CELL}$ and, during this time, $R_{CELL}$ 948 is approximately constant. Also between t1 and t2, the peak detector 900 will keep the highest $V_{BL}$. That is, the increasing $V_{BL}$ is provided to the positive terminal 935 of the op-amp 910, while the fixed voltage (e.g., 2 V) is maintained at the negative terminal 936 of the op-amp 910.

At t2, when $V_{BL}$ exceeds a certain voltage, referred to as a set voltage, $V_{SET}$, $R_{CELL}$ 948 will switch from high to low. This causes $I_{CELL}$ to temporarily increase and become larger than $I_{LIMIT}$, between t2 and t3. Note that the time periods are not necessarily to scale. $V_{BL}$ stops ramping up and starts to drop. The detection circuit 900 detects the drop in $V_{BL}$ at t3 and sets Set_done to high, which is used to pull down $V_{BL}$ by the nMOS discharge transistor 934. The system control logic 330 responds to Set_done by shutting down $I_{LIMIT}$ to provide no further current output.

Specifically, the drop in $V_{BL}$ causes the output of the op-amp 910 to invert, from a positive polarity (high) to a negative polarity (low) or a near zero level, so that the output of the inverter 908 will also invert, from a negative or zero output (low) to a positive output (high). This represents Set_done 950 being set, which causes the discharge transistor 934 to become conductive, discharging the bit line to ground ($V_{BL}$=0 V). As a result of $V_{BL}$ 942 dropping, $I_{CELL}$ 946 also drops.

In FIG. 9a and in the other circuits discussed below, the inputs can be provided under the control of the system control logic circuit 330, and the outputs can be received and processed by the circuit 330 as well.

Advantageously, the bit line is discharged as soon as the memory cell switches to avoid causing a disturbance such as a reset of the cell. Moreover, the set process is completed at the lowest possible value for each individual memory cell since the process is adaptive to each memory cell.

Figure 10A:
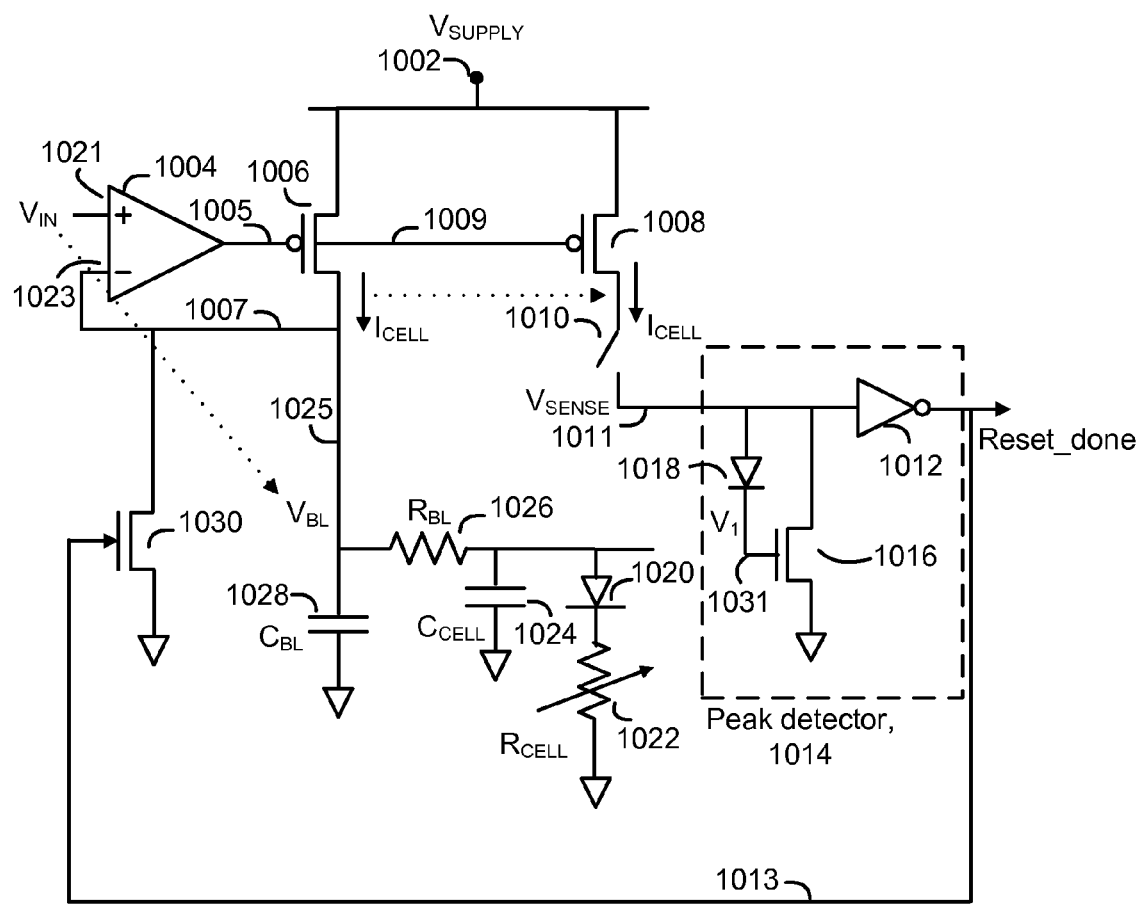
FIG. 10a is a schematic diagram of one embodiment of a circuit used to control a reset process of a memory cell, and FIG. 10b provides associated signal levels vs. time.
Figure 10B:
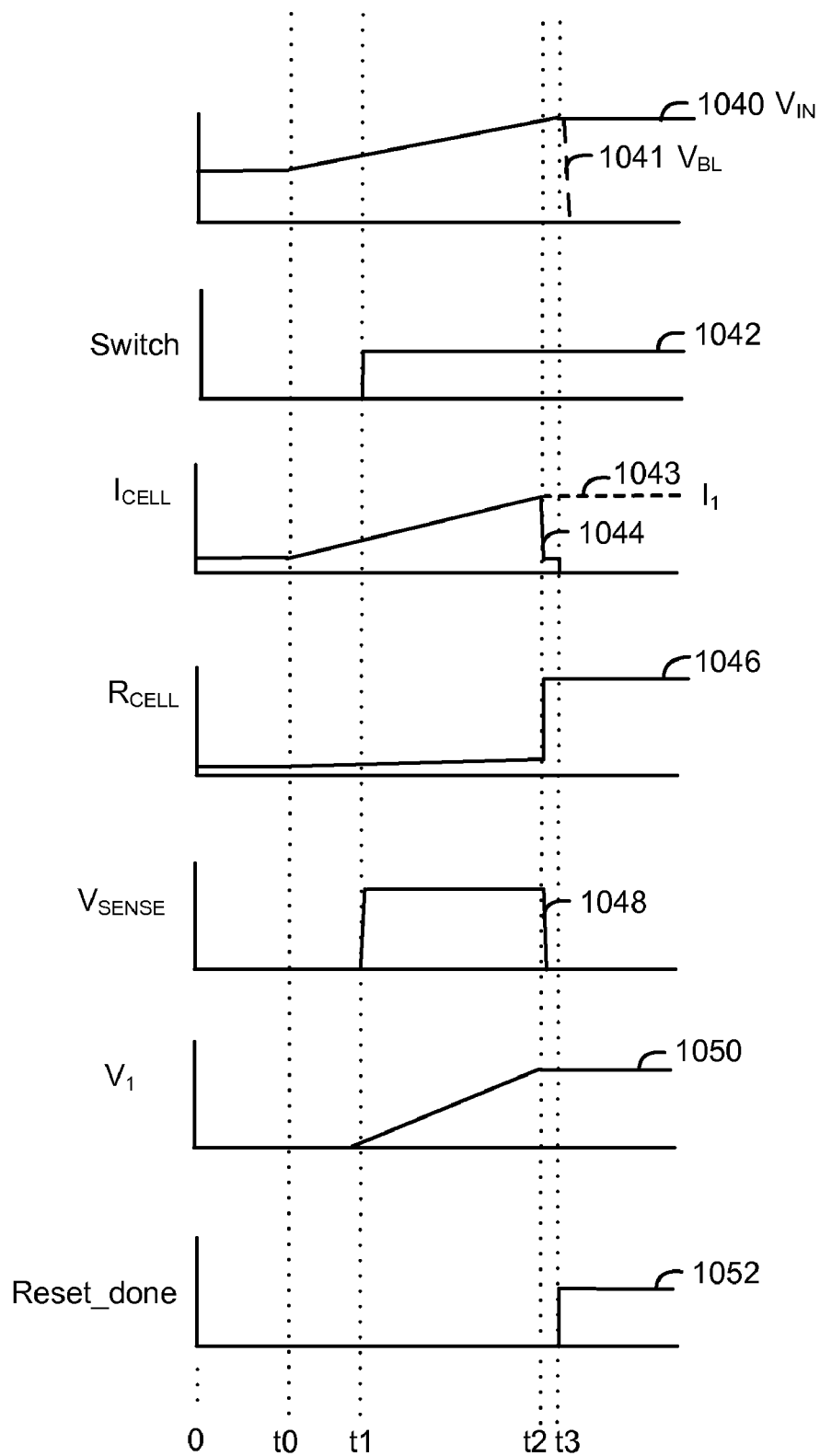

FIG. 10a is a schematic diagram of one embodiment of a circuit used to control a reset process of a memory cell, and FIG. 10b provides associated signal levels vs. time. An op-amp 1004 includes a positive input 1021 which receives an input voltage, $V_{IN}$, and a negative terminal 1023 which receives a feedback voltage via a line 1007, thus forming an op-amp loop. An output of the op-amp on line 1005 is provided to a pMOS 1006. A source side of the pMOS 1006 receives $V_{SUPPLY}$ via a node 1002, while a drain side of the pMOS 1006 is coupled to a bit line 1025. $V_{IN}$ is essentially transferred to $V_{BL}$ via the op-amp circuit. The bit line 1025 is coupled to a selected memory cell, which is represented by a variable resistance 1022 ($R_{CELL}$), a diode 1020, and a capacitance 1024 ($C_{CELL}$). A resistance and capacitance of the bit line are represented by $R_{BL}$ 1026 and $C_{BL}$ 1028, respectively.

The op-amp loop generates the cell current, $I_{CELL}$ on the bit line 1025 via the pMOS 1006. The op-amp loop also generates the cell current, $I_{CELL}$ on a sense line 1011 via a pMOS 1008, when a switch 1010 is closed (made conductive). A source side of the pMOS 1008 receives $V_{SUPPLY}$ via the node 1002, while the drain side of the pMOS 1008 is coupled to the sense line 1011 via the switch 1010.

A current peak detector 1014 includes a diode 1018 coupled to the gate of a transistor 1016 via a path 1031, and an inverter 1012, whose output is a signal "Reset_done," which is provided to the system control logic circuit 330, and to a discharge transistor 1030 via a path 1013.

As with the set process, the reset process applies the lowest possible voltage to the memory cell to achieve a reset, so that there is a smaller chance of a disturbance to the memory cell.

In one example implementation, the reset process proceeds as follows. Referring also to FIG. 10b, $V_{IN}$ (1040) is ramped up from an initial level, e.g., 1.5 V, starting at t0. At t0, $V_{BL}$ 1041 and $I_{CELL}$ 1044 begin to ramp up in correspondence with $V_{IN}$.

At t1, the switch 1010 is closed so that $I_{CELL}$ is also provided on the sense line 1011. A delay between t0 and t1 in closing the switch 1010 can be implemented to allow the op-amp loop to stabilize. An example delay of 0.1 μsec. may be used in one possible implementation. A switch signal 1042 is set high, indicating that the switch is closed or conductive. The initial level of $V_{IN}$ is just enough to cause the diode 1018 to be conductive when the switch 1010 is closed. The voltage at the sense line, $V_{SENSE}$ 1048, is substantially constant between t1 and t2. Due to the conductivity of the diode 1018, charge begins to accumulate on the line 1031, which is coupled to the gate of the transistor 1016. The voltage $V_1$ 1050 on the line 1031, and a corresponding current $I_1$ 1043, which is the same as $I_{CELL}$ between t1 and t2, also begins to ramp up.

Once $V_{BL}$ and $I_{CELL}$ increase to a point where $R_{CELL}$ 1046 switches from low to high, at t2, $I_{CELL}$ 1044 drops, but the current peak detector 1014 keeps drawing the peak value of $I_{CELL}$ from the sense line 1011. This helps to maintain the output signal (Reset_done) stable. $V_{SENSE}$ 1048 also drops from high to low, at or near 0 V, causing Reset_done to be set, from low to high. Reset_done is provided via a path 1013 to a discharge transistor 1030 to immediately discharge the bit line 1025 to avoid setting the memory cell. Specifically, the line 1005 is pulled up to the same level as $V_{SUPPLY}$ to cut off the pMOS 1006, when the nMOS 1030 is made conductive by Reset_done. Note that $V_{IN}$ can continue to increase or become fixed at t3, as long as the line 1005 is pulled up to $V_{SUPPLY}$.

Specifically, the diode 1018 and the nMOS 1016 form a peak current detector. When current flowing through the sense line 1011 increases, $V_1$ also increases. When the current reaches a peak level and starts to turn lower, $V_1$ remains the same because the charge is trapped between the diode 1018 and the transistor 1016. As a result, the nMOS 1016 continues to draw the peak current from the sense line. This peak current is larger than the decreasing $I_{CELL}$, so that as $V_{SENSE}$ drops, Reset_done goes high.

Figure 11A:
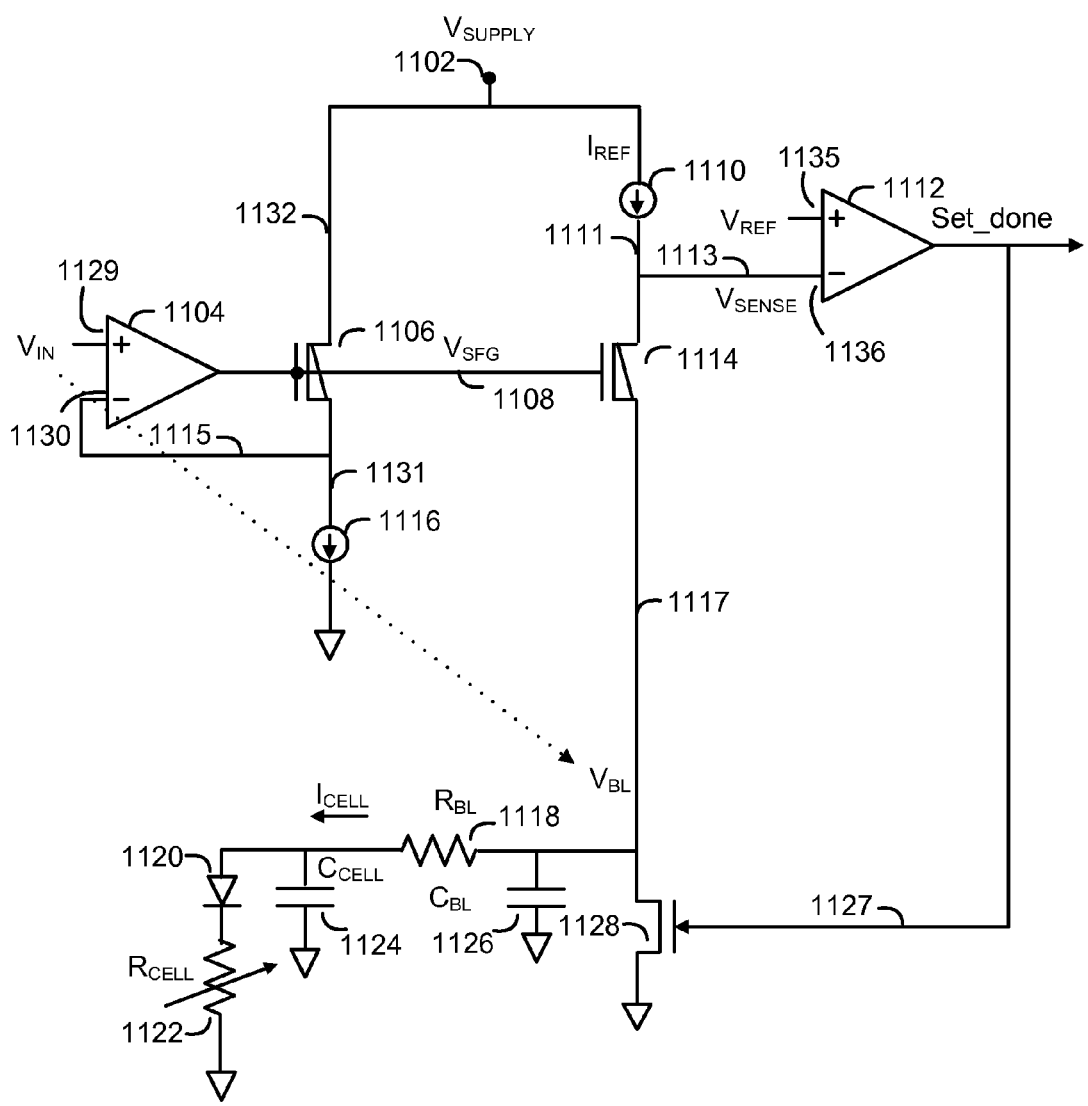
FIG. 11a is a schematic diagram of another embodiment of a circuit used to control a set process of a memory cell, and FIG. 11b provides associated signal levels vs. time.
Figure 11B:
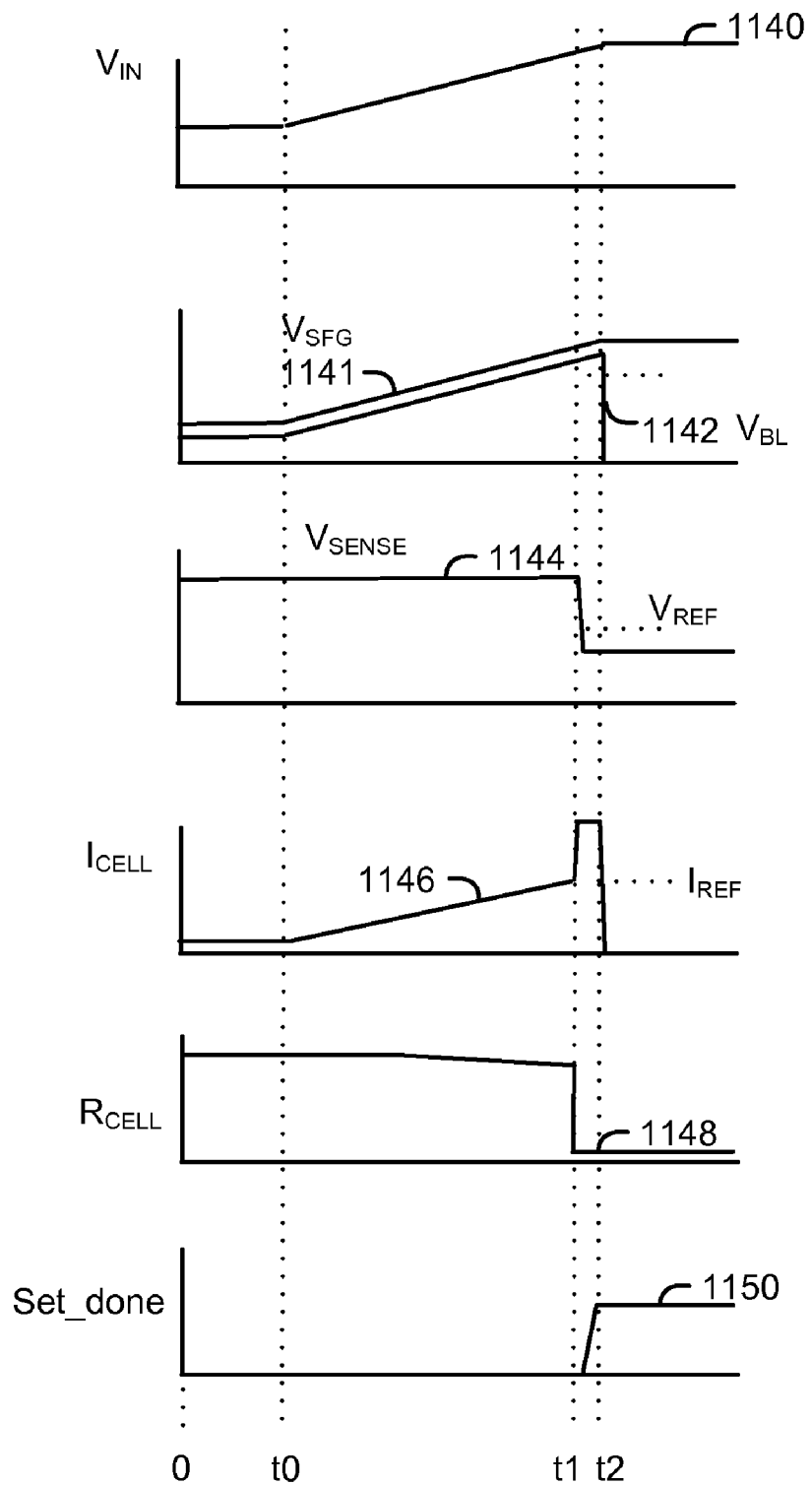

FIG. 11a is a schematic diagram of another embodiment of a circuit used to control a set process of a memory cell, and FIG. 11b provides associated signal levels vs. time. The embodiment here can provide faster detection and shutoff because it does not use a pre-charge phase. Further, there is no stability issue since an op-amp loop is not used for detection. An op-amp loop may become unstable, especially if there is an abrupt current change in the selected bit line. Here, a source-follower configuration is used for nMOS transistors 1106 and 1114. An op-amp loop includes an op-amp 1104, nMOS 1106 and a feedback path 1115. $V_{IN}$ is provided at the positive input 1129 of the op-amp 1104, and the line 1115 is provided to the negative input 1140 of the op-amp 1104.

The op-amp 1104 provides a common voltage at the gates of the nMOSs 1106 and 1114, on a path 1108, so that a voltage at a source of the transistors follows the voltage at the gate, $V_{SFG}$. The drain is at the opposite side of the transistor. A current source 1116 provides the current which flows through the nMOS 1106 at a similar level as the current which flows through the nMOS 1114. This allows the gate-to-source voltage, $V_{GS}$, of the two nMOSs to be similar, and allows the voltage on line 1115 to be substantially equal to $V_{IN}$ and $V_{BL}$. $V_{BL}$ on bit line 1117 follows $V_{SFG}$, the source-follower gate voltage on path 1108, which in turn follows $V_{IN}$. The drain of the nMOS transistor 1106 is coupled to $V_{SUPPLY}$ at node 1102 via path 1132. The drain of the nMOS transistor 1114 is coupled to a current source 1110 via a path 1111. The current source 1110 provides a reference current, $I_{REF}$, and is coupled to the node 1102. The bit line 1117 is coupled to a selected memory cell, which is represented by a variable resistance 1122 ($R_{CELL}$), a diode 1120, and a capacitance 1124 ($C_{CELL}$). A resistance and capacitance of the bit line are represented by $R_{BL}$ 1118 and $C_{BL}$ 1126, respectively.

A comparator 1112 includes a positive input 1135 which receives a fixed reference voltage, $V_{REF}$, and a negative input which receives a sense voltage, $V_{SENSE}$, on path 1113. An output of the comparator 1112 is the Set_done signal, which indicates that the set process has been completed. The Set_done signal is provided via a path 1127 to a discharge nMOS transistor 1128.

Referring also to FIG. 11b, $V_{IN}$ 1140 is ramped up between t0 and t1. $V_{SFG}$ 1141, $V_{BL}$ 1142 and $I_{CELL}$ 1146 follow $V_{IN}$. $V_{SFG}$ may exceed $V_{BL}$ by the threshold voltage of the nMOS 1114. $V_{SENSE}$ 1144 is substantially constant. $R_{CELL}$ 1148 is at a relatively high level. Before the set occurs at t1, when $R_{CELL}$ switches to a low level, $I_{CELL}$ is smaller than $I_{REF}$ due to the high level of $R_{CELL}$. As a result, $V_{SENSE}$ is close to $V_{SUPPLY}$ and higher than $V_{REF}$. This keeps the output of the comparator 1112 low, because the output is low when the negative input 1146 is greater in magnitude than the positive input 1135. When the set occurs, at t1, $R_{CELL}$ decreases, causing $I_{CELL}$ to increase to a level which exceeds $I_{REF}$.

At t2, $V_{SENSE}$ drops below $V_{REF}$, causing the Set_done signal 1150 to go high. When Set_done goes high, the discharge transistor 1128 is made conductive to immediately discharge the bit line 1117 to $V_{BL}=0$ V so that no disturbance can occur. Note that the current flowing through the nMOS 1114 is ideally controlled by its $V_{GS}$, no matter how the drain-to-source voltage, $V_{DS}$, changes.

Figure 12A:
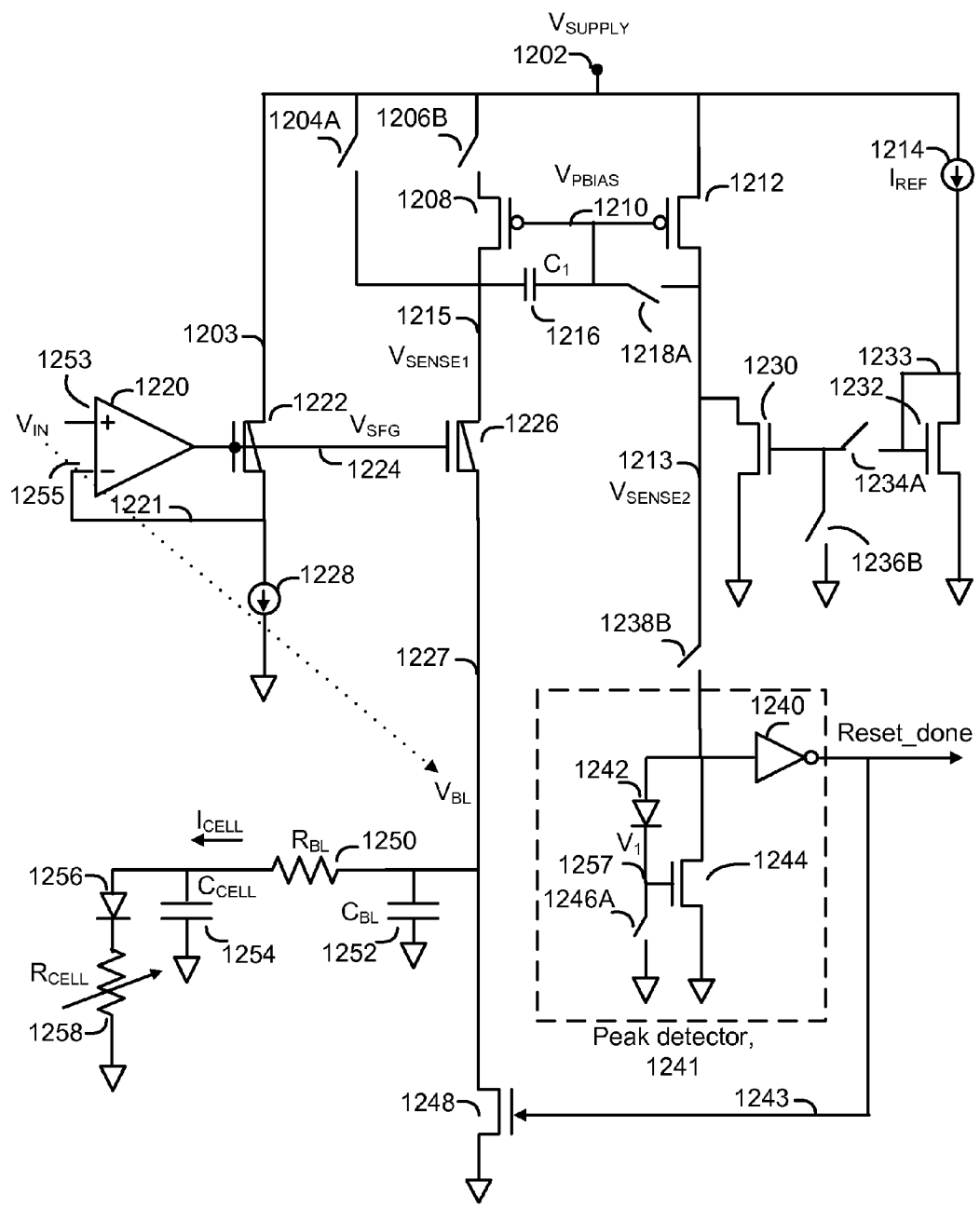
FIG. 12a is a schematic diagram of another embodiment of a circuit used to control a reset process of a memory cell, and FIG. 12d provides associated signal levels vs. time.

FIG. 12a is a schematic diagram of one embodiment of a circuit used to control a reset process of a memory cell, and FIG. 12d provides associated signal levels vs. time. As before, there is no stability issue since an op-amp loop is not used for detection. The circuit uses the source-follower configuration to ramp up the voltage on the memory cell without any loop stability issues. Also, we use the capacitor $C_1$ 1216 to level-shift the gate voltage of a current mirror (which includes pMOS transistors 1208 and 1212) to allow a lower required power supply voltage. Furthermore, a two phase process occurs, which includes an initialization process of a capacitor voltage drop. The voltage drop can be similar in magnitude to the pMOS threshold voltage so that $V_{SENSE}$ can be more robust to process variations when pMOSs 1208 and 1212 act as a current mirror to detect the reset in a second phase.

An op-amp loop includes an op-amp 1220, an nMOS 1222 and a feedback path 1221. $V_{IN}$ is provided at the positive input 1253 of the op-amp 1220, and the line 1221 is provided to the negative input 1255 of the op-amp 1220.

The op-amp 1220 provides a common voltage at the gates of the nMOSs 1222 and 1226, on a path 1224, so that a voltage at a source of the transistors follows the voltage at the gate, $V_{SFG}$. A current source 1228 provides the current which flows through the nMOS 1222 at a similar level as the current which flows through the nMOS 1226. This allows the gate-to-source voltage, $V_{GS}$, of the two nMOSs to be similar, and allows the voltage on line 1221 to be substantially equal to $V_{IN}$ and $V_{BL}$. $V_{BL}$ on bit line 1227 follows $V_{SFG}$, the source-follower gate voltage on path 1224, which in turn follows $V_{IN}$. The drain of the nMOS transistor 1222 is coupled to $V_{SUPPLY}$ at node 1202 via path 1203. The drain of the nMOS transistor 1226 is coupled to $V_{SUPPLY}$ via a path 1215 when a switch 1204A is closed (made conductive), or to a source of the pMOS 1208 and to the capacitor $C_1$ 1216. A drain of the pMOS 1208 is coupled to the node 1202 via a switch 1206B. A gate of the pMOS on line 1210 is coupled to the gate of the pMOS 1212 (to form a pair of mirror transistors) and to one side of the capacitor 1216. The capacitor 1216 is also coupled to a drain of the pMOS 1212, and to a sense line 1213, via a switch 1218A.

The sense line 1213 can be coupled as a mirror of a current source 1214 via nMOS transistors 1230 and 1232, path 1233, switch 1234A and switch 1236B. The sense line 1213 can also be coupled to a current peak detector 1241, which is similar to the peak detector 1014 of FIG. 10a, via a switch 1238B. The current peak detector 1241 includes a diode 1242 coupled to the gate of a transistor 1244 via a path 1257, and to ground via a switch 1246A, and an inverter 1240, whose output is the signal "Reset_done," which is provided to the system control logic circuit 330, and to a discharge transistor 1248 via a path 1243.

The bit line 1227 is coupled to a selected memory cell, which is represented by a variable resistance 1258 ($R_{CELL}$), a diode 1256, and a capacitance 1254 ($C_{CELL}$). A resistance and capacitance of the bit line are represented by $R_{BL}$ 1250 and $C_{BL}$ 1252, respectively.

The reset process can occur in two phases, where switches that are represented by reference numbers ending in "A" are closed (conductive) in the first phase, and open (non-conductive) in the second phase. Similarly, switches that are represented by reference numbers ending in "B" are open (non-conductive) in the first phase, and closed (conductive) in the second phase.

Figure 12B:
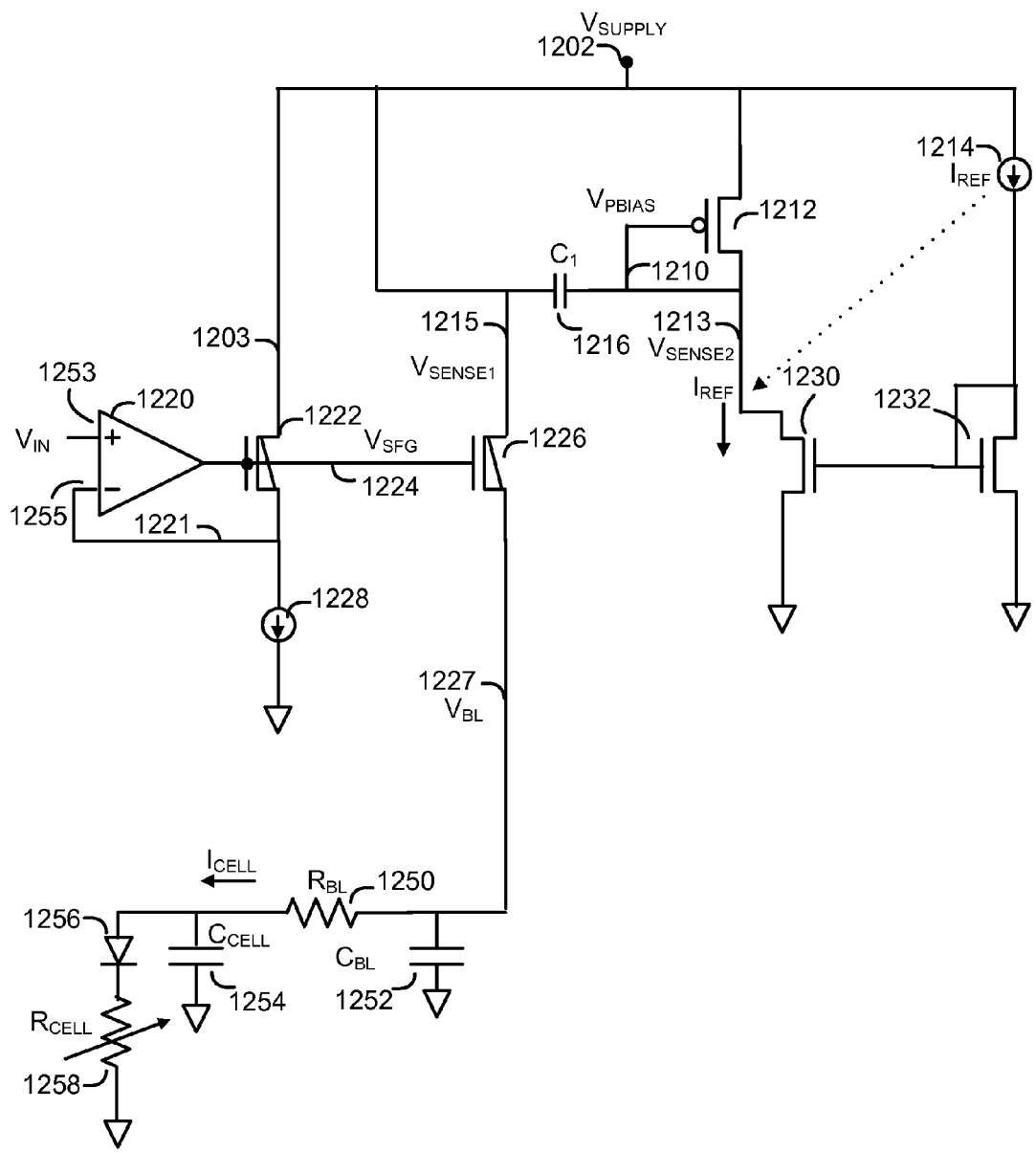
FIG. 12b depicts the circuit of FIG. 12a in a first phase of operation.

FIG. 12b depicts the circuit of FIG. 12a in a first phase of operation. $V_{IN}$ 1260 is provided to the op-amp loop to generate $V_{SFG}$ 1262 on line 1224 for the gate voltage of the source follower nMOS 1226, so that $V_{BL}$ 1264 follows $V_{SFG}$ 1262. $V_{SFG}$ exceeds $V_{BL}$ by the threshold voltage of the nMOS 1226 and an additional increment ($\Delta$). Thus, $V_{BL}$ follows $V_{IN}$.

Referring also to FIG. 12d, in a first phase of the reset process, between t0 and t1, an "A" switch control signal 1276 indicates that we make the "A" switches conductive, and a "B" switch control signal 1278 indicates that we make the "B" switches non-conductive. By controlling these switches, we can pull up $V_{SENSE1}$ 1270 to the power supply voltage, $V_{SUPPLY}$, and let $V_{PBIAS}$ 1271 on line 1210 follow $V_{SUPPLY}$, at a level which is equal to $V_{SUPPLY}$ less the threshold voltage of the pMOS 1212 and an additional increment ($\Delta$). $V_{SENSE2}$ 1272 is equal to $V_{PBIAS}$ in this phase. A voltage drop occurs across $C_1$ 1216 which is equal to the threshold voltage of the pMOS 1212 plus an additional increment ($\Delta$). Also, a reference current $I_{REF}$ of the current source 1214 is mirrored to the line 1213 via nMOS transistors 1230 and 1232.

Figure 12C:
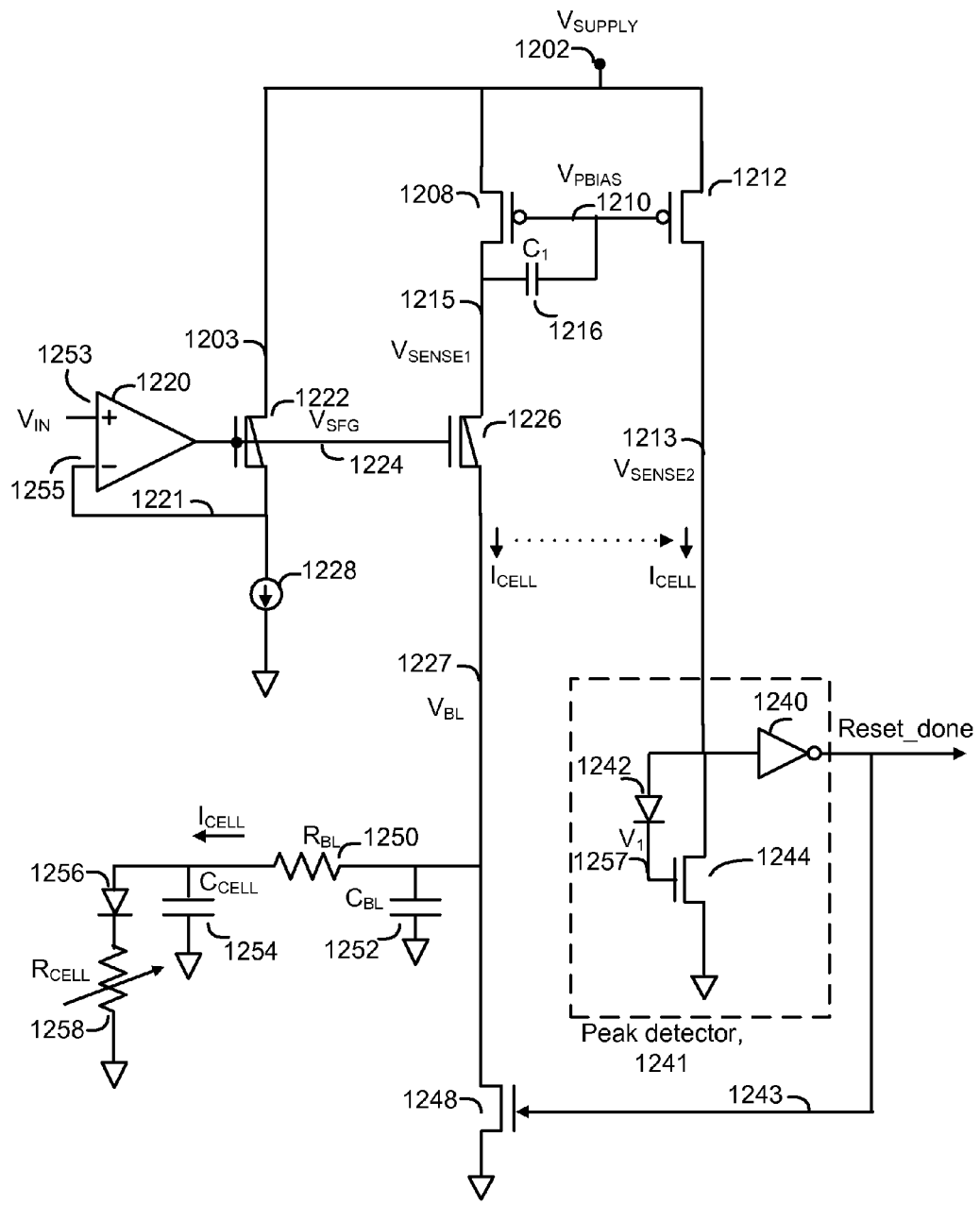
FIG. 12c depicts the circuit of FIG. 12a in a second phase of operation.

FIG. 12c depicts the circuit of FIG. 12a in a second phase of operation. Referring also to FIG. 12d, in the second phase of the reset process, after t1, the "A" switch control signal 1276 indicates that we make the "A" switches non-conductive, and the "B" switch control signal 1278 indicates that we make the "B" switches conductive.

The input voltage $V_{IN}$ 1260 is ramped up. Due to the source-follower arrangement of the nMOS 1226, $V_{BL}$ will also ramp up, as will $I_{CELL}$ 1266. Also, pMOS 1208 with $C_1$ as a level shifter will provide the increasing $I_{CELL}$ and copy it to the pMOS 1212 as a current mirror to provide $I_{CELL}$ on line 1213 as an input to the current peak detector 1241. This current will be tracked by the current peak detector 1241. Once the memory cell is reset, at t2, $R_{CELL}$ 1268 jumps to a higher level, and $I_{CELL}$ 1266 drops from a peak value of $I_1$. The current peak detector 1241 senses the reversing point and sets the signal Reset_done 1280 high. Reset_done is provided via path 1243 to an nMOS discharge transistor 1248 to immediately discharge the bit line 1227 (see $V_{BL}$ at curve 1264 in FIG. 12d) to avoid any further disturbance. The peak detector 1241 operates as discussed in connection with the peak detector 1014 of FIG. 10a.

In particular, the initial level of $V_{IN}$ is just enough to cause the diode 1242 to be conductive when the switch 1238B is closed. The voltage at the sense line, $V_{SENSE}$2 1272 is substantially constant between t1 and t2. Due to the conductivity of the diode 1242, charge begins to accumulate on the line 1257, which is coupled to the gate of the transistor 1244. The voltage $V_1$ 1272 (FIG. 12d) on the line 1257, and the corresponding current $I_1$ 1265, which is the same as $I_{CELL}$ between t1 and t2, also begins to ramp up. Once $V_{BL}$ and $I_{CELL}$ increase to a point where $R_{CELL}$ 1258 switches from low to high, at t2, $I_{CELL}$ 1266 drops, but the current peak detector 1241 keeps drawing the peak value of $I_{CELL}$ from the sense line 1213.

$V_{SENSE2}$ 1272 also drops from high to low, at or near 0 V, causing Reset_done to be set, from low to high, by the inverter 1240.

To understand the power reduction which is achieved by the circuit, note that for the pMOS transistors 1208 and 1212, the gate voltage $V_G$ can be lower than the source voltage $VS=V_{SUPPLY}$. That is, $V_{GS}(=V_G-V_S)<0$, in which case the pMOS transistor operates in a depletion mode of operation.

Specifically, $V_G=V_{SUPPLY}-V_{TH}$, where $V_{TH}$ is the threshold voltage of the pMOS 1212. To achieve this, we choose a $C_1$ such that $V_{C1}=V_{TH}$. In practice, $V_G$ can be lower than $V_S$ by an additional delta ($\Delta$) to ensure that the pMOS 1212 remains conductive. Thus, $V_{C1}=V_{TH}+\Delta$. This allows us to avoid an increase to $V_{SUPPLY}$ which would otherwise be needed if an nMOS transistor was used which required $V_{GS}>0$ to maintain the transistor in a conductive state.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus for detecting a set process for a reversible resistance-switching element in a memory device, comprising:
   a bit line which is coupled to the reversible resistance-switching element;
   a current supply, the bit line is connected as a current mirror of the current supply, the current supply causes a voltage of the bit line to ramp up until the voltage of the bit line is sufficient to switch a resistance of the reversible resistance-switching element to a lower level; and
   a peak detector which is coupled to the bit line, the peak detector detects when the resistance of the reversible resistance-switching element switches.

2. The apparatus of claim 1, further comprising:
   a pre-charge circuit which pre-charges the bit line before the voltage of the bit line is ramped up.

3. The apparatus of claim 2, wherein:
   the peak detector comprises an operational amplifier, a first input terminal of the operational amplifier is coupled to the bit line, and an output signal of the operational amplifier is inverted when the resistance of the reversible resistance-switching element is switched; and
   the pre-charge circuit pre-charges a second input terminal of the operational amplifier while pre-charging the bit line.

4. The apparatus of claim 1, further comprising:
   a discharge transistor which is responsive to the peak detector, the discharge transistor discharges the bit line when an output signal of the peak detector is inverted.

5. Apparatus for detecting a reset process for a reversible resistance-switching element in a memory device, comprising:
   an operational amplifier, a ramped up voltage is input to a first input terminal of the operational amplifier;
   a bit line which is coupled to the reversible resistance-switching element;
   the operational amplifier generates a voltage in the bit line which increases in correspondence with the ramped up voltage until the voltage in the bit line reaches a level which is sufficient to switch a resistance of the reversible resistance-switching element to a higher level;

a sense line, the operational amplifier generates a current in the sense line which increases in correspondence with the ramped up voltage until the resistance of the reversible resistance-switching element switches to a higher level;

a peak detector coupled to the sense line, the peak detector detects when the resistance of the reversible resistance-switching element switches, and includes circuitry which draws current from the sense line before and after the reversible resistance-switching element switches.

6. The apparatus of claim 5, wherein:
the circuitry draws current from the sense line at a peak level after the peak level is reached.

7. The apparatus of claim 5, wherein:
the circuitry includes a transistor which is coupled between the sense line and ground, and a component which is coupled to the sense line and holds a charge at a gate of the transistor to draw current from the sense line before and after the reversible resistance-switching element switches.

8. The apparatus of claim 5, wherein:
a voltage on the sense line is substantially constant while the current in the sense line increases until a peak level is reached, after which the voltage on the sense line drops.

9. The apparatus of claim 5, further comprising:
a switch in the sense line, the switch is made conductive after a predetermined delay after a time when the ramped up voltage is first input to the first input terminal of the operational amplifier.

10. Apparatus for detecting a set process for a reversible resistance-switching element in a memory device, comprising:
an operational amplifier, a ramped up voltage is input to a first input terminal of the operational amplifier;
a first transistor having a gate which is coupled to the operational amplifier, the operational amplifier provides a voltage at the gate, a voltage at a source of the first transistor follows the voltage at the gate;
a bit line which is coupled to the reversible resistance-switching element and to the source of the first transistor; and
a comparator having a first input terminal coupled to a drain of the first transistor and a second input terminal which receives a fixed reference voltage.

11. The apparatus of claim 10, wherein:
when the ramped up voltage is input to the first input terminal of the operational amplifier, the voltage at the bit line is ramped up until it reaches a level which is sufficient to switch a resistance of the reversible resistance-switching element to a lower level, at which time a voltage at the drain of the first transistor drops below a level of the fixed reference voltage, thereby inverting an output signal of the comparator.

12. The apparatus of claim 10, further comprising:
a reference current source coupled to the source of the first transistor.

13. The apparatus of claim 10, further comprising:
a second transistor having a gate which is coupled to the operational amplifier; and
a current source coupled to a source of the second transistor.

14. Apparatus for detecting a reset process for a reversible resistance-switching element in a memory device, comprising:
an operational amplifier, a ramped up voltage is input to a first input terminal of the operational amplifier;
a first transistor having a gate which is coupled to the operational amplifier, the operational amplifier provides a voltage at the gate, a voltage at a source of the first transistor follows the voltage at the gate;
a bit line which is coupled to the reversible resistance-switching element and to the source of the first transistor;
a sense line which is connected as a mirror of the bit line; and
a peak detector coupled to the sense line to detect when a resistance of the reversible resistance-switching element switches to a higher level.

15. The apparatus of claim 14, wherein:
the sense line is connected as the mirror of the bit line via a pair of mirror pMOS transistors, gates of the mirror pMOS transistors are coupled to a drain of the first transistor via a charge storage component.

16. The apparatus of claim 15, further comprising:
at least a first switch which is controlled to charge the charge storage component before the ramped up voltage is input to the first input terminal of the operational amplifier.

17. The apparatus of claim 14, wherein:
the sense line is connected as the mirror of the bit line via a pair of pMOS mirror transistors, each pMOS mirror transistor is in a conductive state with a negative gate-to-source voltage.

18. The apparatus of claim 14, wherein:
the peak detector comprises an inverter coupled to the sense line, an output of the inverter is inverted when the resistance of the reversible resistance-switching element switches to the higher level.

19. The apparatus of claim 14, further comprising:
circuitry coupled to the sense line which draws current from the sense line at a peak level after the resistance of the reversible resistance-switching element switches to the higher level.

20. The apparatus of claim 14, wherein:
the operational amplifier generates a ramped up output voltage, a voltage in the bit line is ramped up in correspondence with the ramped up output voltage until the voltage in the bit line reaches a level which is sufficient to switch the resistance of the reversible resistance-switching element to the higher level, a voltage in the sense line is ramped up in correspondence with the ramped up output voltage, after which the voltage in the sense line drops.

* * * * *